(12) United States Patent
Kudo et al.

(10) Patent No.: US 8,623,589 B2
(45) Date of Patent: Jan. 7, 2014

(54) BOTTOM ANTIREFLECTIVE COATING COMPOSITIONS AND PROCESSES THEREOF

(75) Inventors: Takanori Kudo, Bedminster, NJ (US); Alberto Dioses, Doylestown, PA (US); Edward Ng, Belle Mead, NJ (US); Srinivasan Chakrapani, Bridgewater, NJ (US); Munirathna Padmanaban, Bridgewater, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 50 days.

(21) Appl. No.: 13/153,765

(22) Filed: Jun. 6, 2011

(65) Prior Publication Data

US 2012/0308939 A1 Dec. 6, 2012

(51) Int. Cl.
G03F 7/38 (2006.01)
G03F 7/40 (2006.01)
C09D 5/00 (2006.01)
G03F 7/039 (2006.01)
G03F 7/11 (2006.01)

(52) U.S. Cl.
USPC ............ 430/326; 430/271.1; 430/288.1; 430/270.1; 430/330; 430/327; 524/158; 438/952

(58) Field of Classification Search
None
See application file for complete search history.

(56) References Cited

U.S. PATENT DOCUMENTS

| | | | |
|---|---|---|---|
| 4,491,628 A | 1/1985 | Ito et al. | |
| 5,350,660 A | 9/1994 | Urano et al. | |
| 5,652,297 A | 7/1997 | McCulloch et al. | |
| 5,733,714 A | 3/1998 | McCulloch et al. | |
| 5,843,624 A | 12/1998 | Houlihan et al. | |
| 5,935,760 A | 8/1999 | Shao et al. | |
| 5,939,236 A | 8/1999 | Pavelchek et al. | |
| 5,981,145 A | 11/1999 | Ding et al. | |
| 6,114,085 A | 9/2000 | Padmanaban et al. | |
| 6,187,506 B1 | 2/2001 | Ding et al. | |
| 6,447,980 B1 | 9/2002 | Rahman et al. | |
| 6,465,148 B1 | 10/2002 | Kang et al. | |
| 6,723,488 B2 | 4/2004 | Kudo et al. | |
| 6,737,492 B2 | 5/2004 | Kang et al. | |
| 6,790,587 B1 | 9/2004 | Feiring et al. | |
| 6,818,258 B2 | 11/2004 | Kaneko et al. | |
| 6,849,377 B2 | 2/2005 | Feiring et al. | |
| 6,866,984 B2 | 3/2005 | Jung et al. | |
| 6,916,590 B2 | 7/2005 | Kaneko et al. | |
| 7,264,913 B2 | 9/2007 | Wu et al. | |
| 7,824,837 B2 | 11/2010 | Wu et al. | |
| 8,026,201 B2 | 9/2011 | Zhang et al. | |
| 8,039,202 B2 | 10/2011 | Sui et al. | |
| 2006/0046205 A1 | 3/2006 | Hah et al. | |
| 2006/0292485 A1 | 12/2006 | Ito et al. | |
| 2008/0014529 A1* | 1/2008 | Oberlander | 430/270.1 |
| 2008/0161217 A1* | 7/2008 | Zhang et al. | 510/176 |
| 2010/0119972 A1 | 5/2010 | Houlihan et al. | |
| 2011/0076626 A1 | 3/2011 | Padmanaban et al. | |
| 2011/0086312 A1 | 4/2011 | Dammel et al. | |
| 2012/0122029 A1 | 5/2012 | Kudo et al. | |

FOREIGN PATENT DOCUMENTS

JP 2008-49660 A 3/2008
WO WO-2012/168785 A1 * 12/2012

OTHER PUBLICATIONS

Form PCT/ISA/220, Form PCT/ISA/210, and Form PCT/ISA/237 for PCT/IB2012/001117 dated Aug. 17, 2012, which corresponds to U.S. Appl. No. 13/153,765.
S. Kodama, et. al., "Synthesis of Novel Fluoropolymer for 157nm Photoresists by Cyclo-polymerization", SPIE vol. 4690, pp. 76-83 (2002).
S. Moon, et. al., "Three-Component Photopolymers Basedon Thermal cross-Linking and Acidolytic De-Cross-Linking of Vinyl Ether Groups. Effects of binder Polymers on Photopolymer Characteristics", Chem. Mater., vol. 6, pp. 1854-1860 (1994).
H. Schacht, et al., "Acid Labile Cross-Linked Units: A Comcept for Improved Positive Deep-UV Photoresists", American Chemical Society Symp. Ser. 706, pp. 78-94 (1998).
T. Yamaoka, et al., "Reactions of vinyl ethers and application to photoreactive process", Trends in Photochemistry & . Photobiology, vol. 7, pp. 45-70 (2001).

* cited by examiner

*Primary Examiner* — Cynthia Hamilton
(74) *Attorney, Agent, or Firm* — Sangya Jain

(57) ABSTRACT

The present invention relates to an antireflective coating composition comprising a crosslinking agent, a polymer comprising at least one chromophore group and at least one hydroxyl and/or a carboxyl group, and an additive, further where the additive has structure 1 and comprises at least one arylene-hydroxyl moiety,

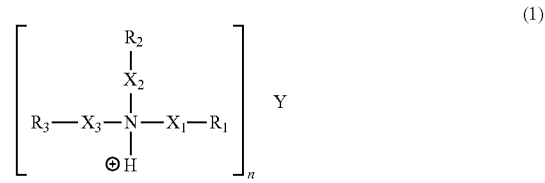

(1)

where Y is selected from an carboxylate anion or sulfonate anion, $R_1$, $R_2$, and $R_3$ are independently selected from unsubstituted $C_1$-$C_8$ alkyl, substituted $C_1$-$C_8$ alkyl, aryl and arylene-hydroxyl; $X_1$, $X_2$, and $X_3$ are independently selected from direct valence bond and $C_1$-$C_8$ alkylene group, and, n=1, 2 or 3. The invention further relates to a process for using the composition.

18 Claims, 5 Drawing Sheets

Figure 1: Examples of carboxylate additive
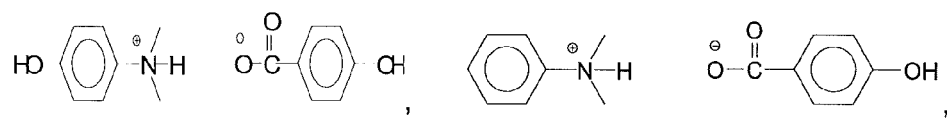
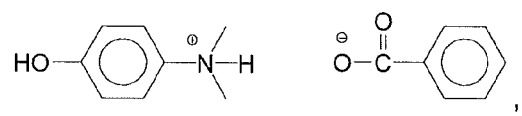
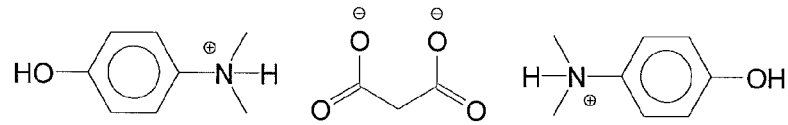
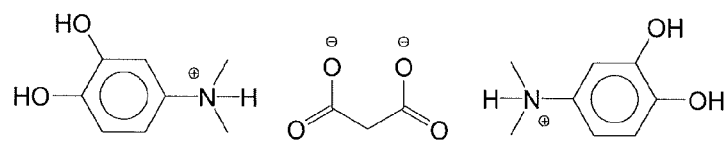
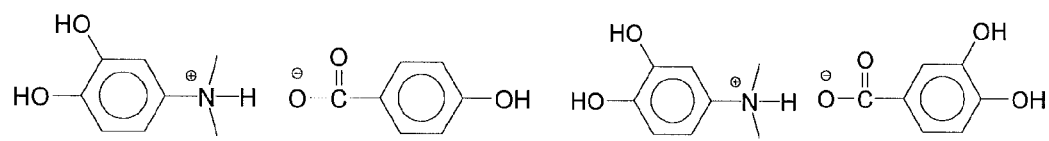
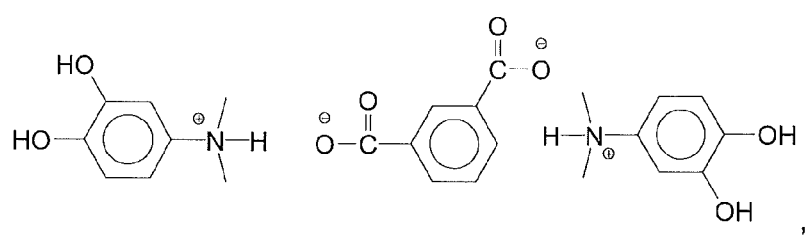
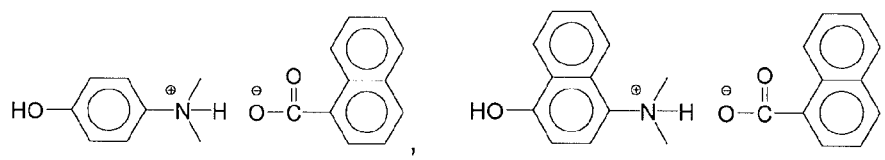

Figure 1: Examples of carboxylate additive (cont'd.)
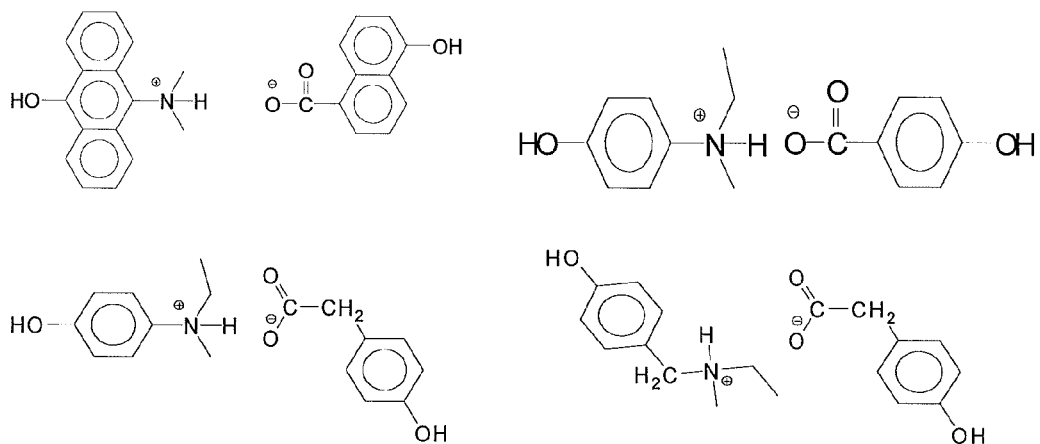
Figure 2: Examples of sulfonate additive
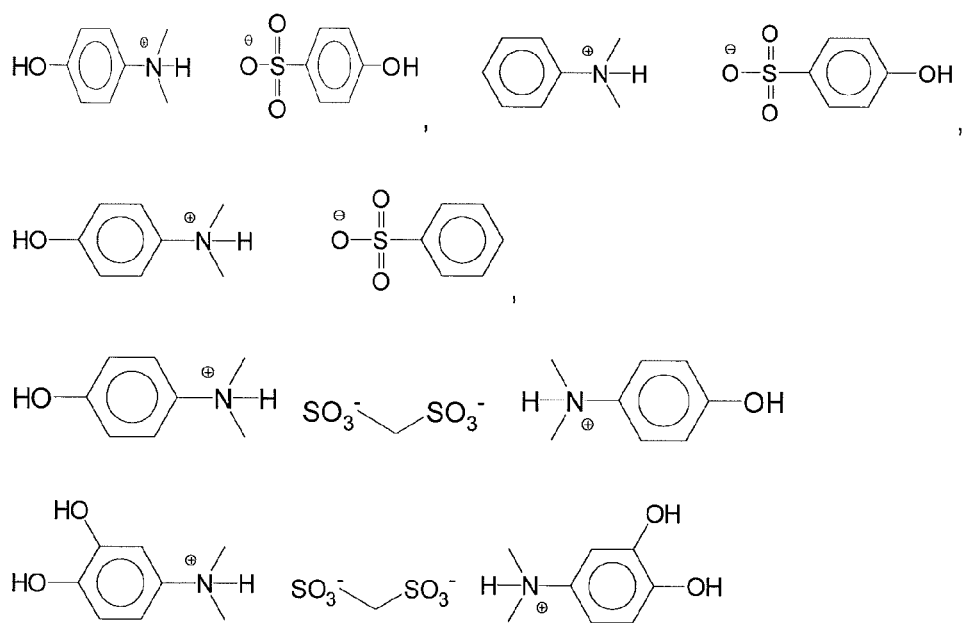

Figure 2: Examples of sulfonate additive (cont'd.)
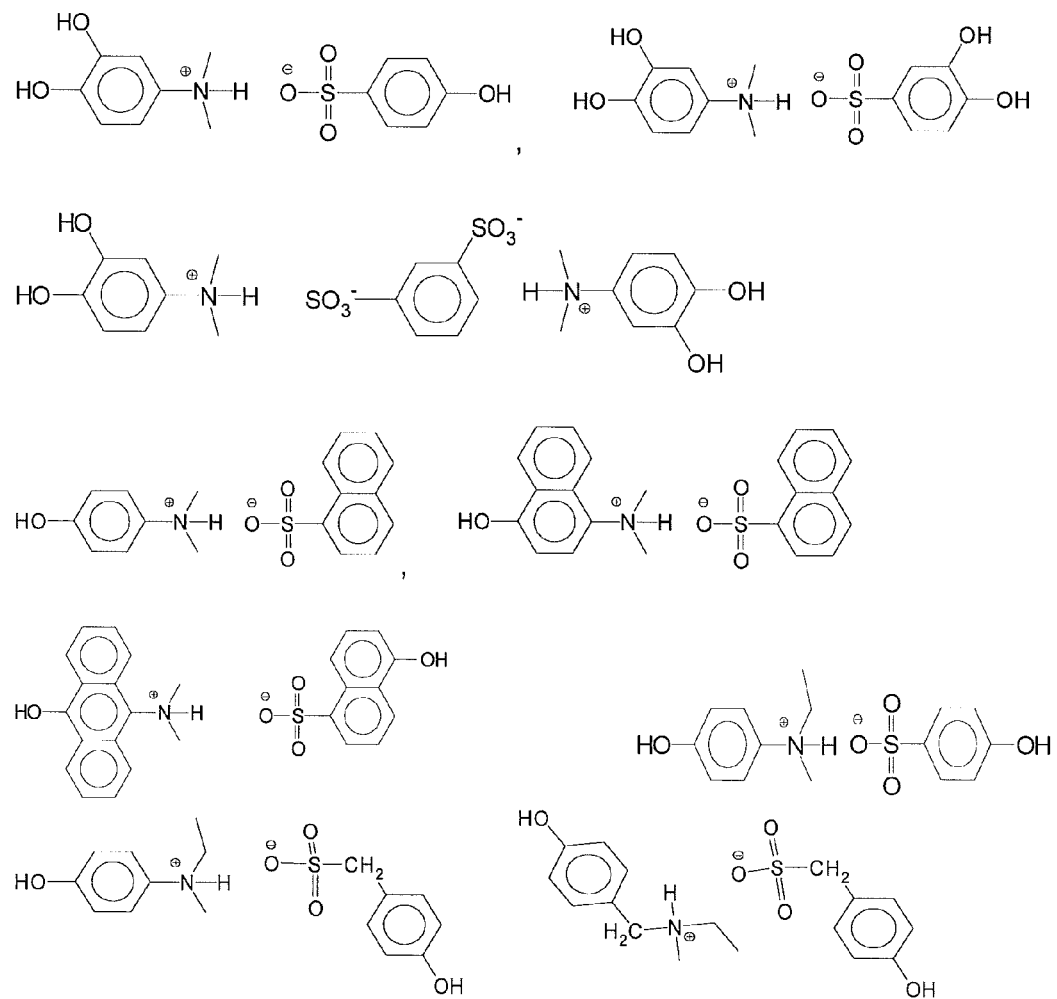

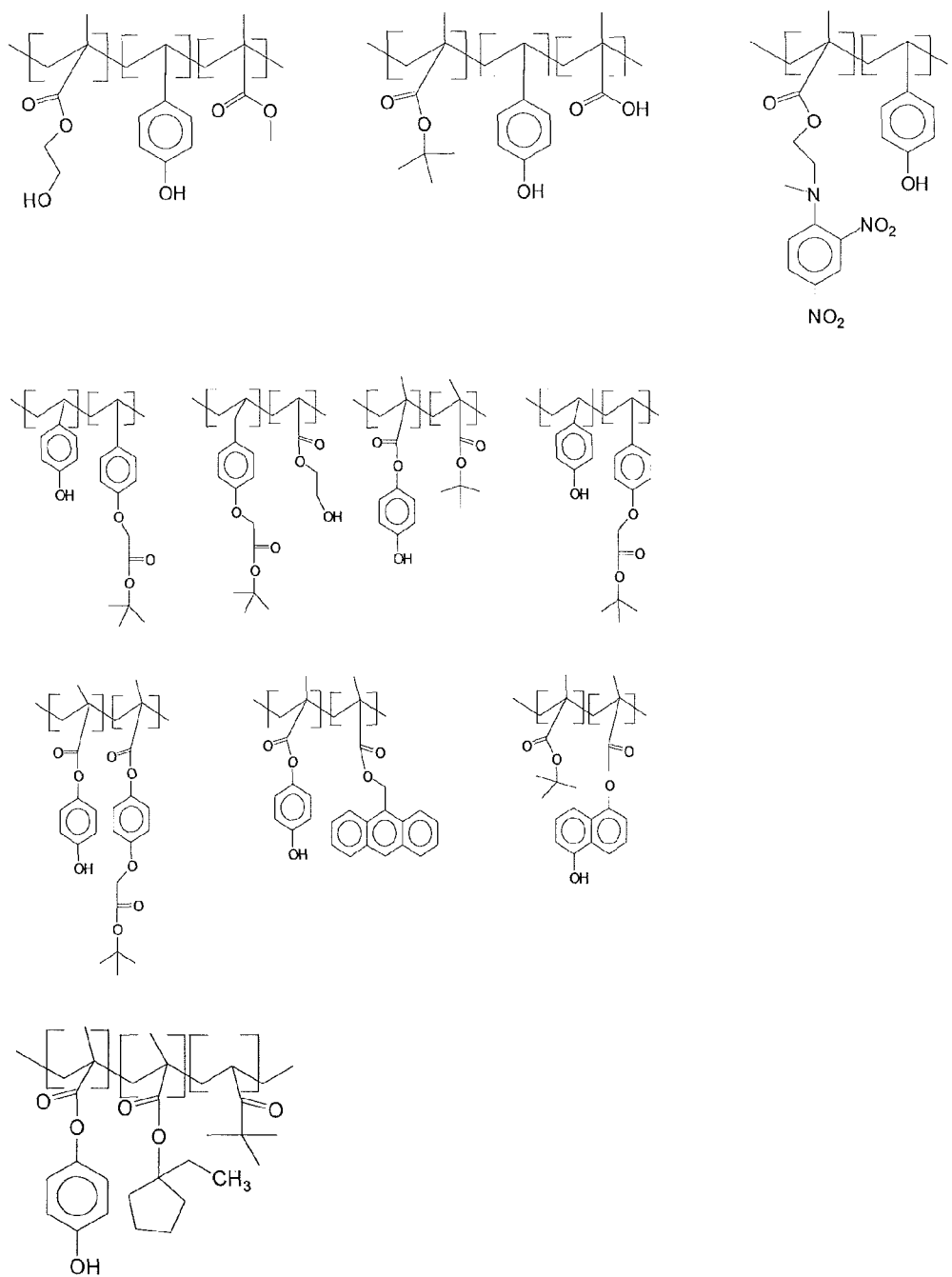
Figure 3: Examples of Polymers

Figure 3: Examples of Polymers (cont'd.)
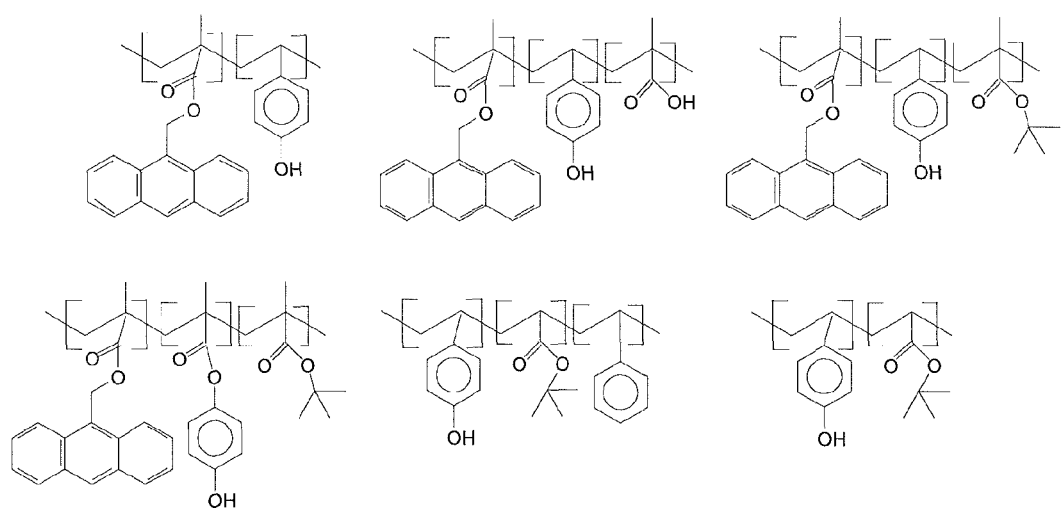

BOTTOM ANTIREFLECTIVE COATING COMPOSITIONS AND PROCESSES THEREOF

The present invention relates to novel antireflective coating compositions and their use in image processing by forming a thin layer of the novel antireflective coating composition between a reflective substrate and a photoresist coating. Such compositions are particularly useful in the fabrication of semiconductor devices by photolithographic techniques, especially those requiring exposure with deep ultraviolet radiation.

Photoresist compositions are used in microlithography processes for making miniaturized electronic components such as in the fabrication of computer chips and integrated circuits. Generally, in these processes, a thin coating of a film of a photoresist composition is first applied to a substrate material, such as silicon wafers used for making integrated circuits. The coated substrate is then baked to evaporate any solvent in the photoresist composition and to fix the coating onto the substrate. The baked and coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

There are two types of photoresist compositions, negative-working and positive-working. When positive-working photoresist compositions are exposed image-wise to radiation, the areas of the photoresist composition exposed to the radiation become soluble in a developer solution while the unexposed areas of the photoresist coating remain relatively insoluble to such a solution. Thus, treatment of an exposed positive-working photoresist with a developer causes removal of the exposed areas of the photoresist coating and the formation of a positive image in the coating, thereby uncovering a desired portion of the underlying substrate surface on which the photoresist composition was deposited. In a negative-working photoresist the developer removes the portions that are not exposed.

The trend towards the miniaturization of semiconductor devices has led both to the use of new photoresists that are sensitive to lower and lower wavelengths of radiation, and also to the use of sophisticated multilevel systems to overcome difficulties associated with such miniaturization.

The use of absorbing antireflective coatings in photolithography is a simpler approach to diminish the problems that result from back reflection of light from highly reflective substrates. The bottom antireflective coating is applied on the substrate and then a layer of photoresist is applied on top of the antireflective coating. The photoresist is exposed image-wise and developed. The antireflective coating in the exposed area is then typically etched and the photoresist pattern is thus transferred to the substrate. Most antireflective coatings known in the prior art are designed to be dry etched. The etch rate of the antireflective film needs to be relatively high in comparison to the photoresist so that the antireflective film is etched without excessive loss of the resist film during the etch process. There are two known types of antireflective coatings, inorganic coatings and organic coatings. These types of coatings have been designed for removal by dry etching.

In addition, photoresist patterns may be damaged or may not be transferred exactly to the substrate if the dry etch rate of the antireflective coating is similar to or less than the etch rate of the photoresist coated on top of the antireflective coating. The etching conditions for removing the organic coatings can also damage the substrate. Thus, there is a need for both organic bottom antireflective coatings that can be dry etched and organic bottom antireflective coatings that can be removed by the photoresist developer without dry etching, and can also provide good lithographic performance, especially for compound semiconductor type substrates, which are sensitive to etch damage.

The novel approach of the present application is to use an absorbing bottom antireflective coating film; especially a bottom antireflective coating that can be dry etched or developed by an aqueous alkaline developer solution. Aqueous removal of the bottom antireflective coating eliminates the dry etch rate requirement of the coating, reduces the cost intensive dry etching processing steps and also prevents damage to the substrate caused by dry etching. The novel bottom antireflective coating compositions of the present invention contain a novel additive, a crosslinking compound and a polymer.

SUMMARY OF THE INVENTION

The present invention relates to an antireflective coating composition comprising a crosslinking agent, an additive, and a polymer comprising at least one chromophore group and at least one hydroxyl and/or a carboxyl group, further where the additive has structure 1 and comprises at least one arylene-hydroxyl moiety,

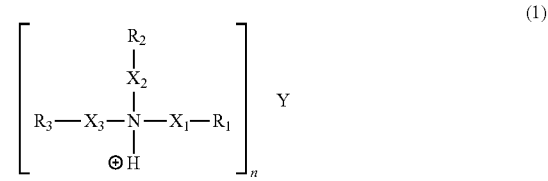

where Y is selected from an carboxylate anion or sulfonate anion, $R_1$, $R_2$, and $R_3$ are independently selected from unsubstituted $C_1$-$C_8$ alkyl, substituted $C_1$-$C_8$ alkyl, aryl and arylene-hydroxyl; $X_1$, $X_2$, and $X_3$ are independently selected from direct valence bond and $C_1$-$C_8$ alkylene group, and, n=1, 2 or 3. The invention further relates to a process for using such a composition.

BRIEF DESCRIPTION OF THE DRAWING

FIG. 1 shows examples of the structures of carboxylate containing additives.

FIG. 2 shows examples of the structures of sulfonate containing additives.

FIG. 3 shows examples of polymers.

DESCRIPTION OF THE INVENTION

The present invention relates to a bottom antireflective coating composition removed after patterning of the photoresist by dry etching or an aqueous alkaline developer. The composition comprises a polymer, a crosslinker and an additive. The polymer may be a crosslinkable polymer comprising a crosslinkable group which crosslinks with the crosslinker. The polymer may be a polymer which comprises a crosslinkable group which crosslinks with the crosslinker and further becomes soluble in the aqueous alkaline developer by the decrosslinking of an acid labile group in the polymer. The invention further relates to a process for using such a composition, especially for imaging with radiation from about 12 nm is to about 450 nm.

In one embodiment, the antireflective coating composition of the present invention relates to a novel absorbing, photoimageable and aqueous developable positive image-forming antireflective coating composition comprising a polymer, a vinyl ether terminated crosslinking agent and a novel crosslinking additive containing at least one arylene-hydroxyl moiety, further where the polymer comprises at least one chromophore group and at least one hydroxyl and/or a carboxyl group, and optionally one unit containing a hydroxyl and/or carboxyl group capped with a compound to form an acid labile group, Optionally, the composition may further contain at least one compound selected from a group consisting of a photoacid generator, a photoacid generator comprising a vinyl ether which also acts as a vinyl ether crosslinker, photoacid generator comprising a hydroxyl group capable of crosslinking with a vinyl ether, a base additive consisting of an amine and mixtures thereof. The novel composition is used to form a film which is coated on a substrate and below a positive photoresist, in order to prevent reflections in the photoresist from the substrate. This antireflective coating is photoimageable with the same wavelength of light as the top photoresist, and is also developable with the same aqueous alkaline developing solution as that used to typically develop the photoresist, thus forming a pattern in the novel antireflective coating film. The antireflective coating composition comprises a polymer, a crosslinking agent and the novel additive. The antireflective coating composition is coated on a reflective substrate. The edge bead which may form during the spinning process can then be removed using an edgebead removing solvent, since the polymer is still soluble in solvents used as edgebead removers. The coating is then baked to remove the solvent of the coating solution and also to crosslink the coating, in order to prevent, or minimize the extent of intermixing between the layers and make the coating insoluble in the aqueous alkaline developer. Although not being bound by theory, it is believed that during the baking step a reaction takes place between the crosslinking agent, especially compounds containing vinyl ether terminal groups, and the polymer with the hydroxyl and/or a carboxyl group in the antireflective coating, to form acid labile groups within the coating. After baking and curing the antireflective coating is essentially insoluble in both an alkaline developing solution and the solvent of the photoresist.

A positive photoresist is then coated on top of the cured antireflective coating and baked to remove the photoresist solvent. Prior to exposure to actinic radiation both the photoresist and the antireflective coating are insoluble in the aqueous alkaline developing solution of the photoresist. The bilevel system is then imagewise exposed to radiation in one single step, where an acid is then generated in both the top photoresist and the bottom antireflective coating. If a photoacid generator is present in the antireflective coating it is photolysed. When a photoacid generator is not present in the antireflective coating, the acid may diffuse from the photoresist into the antireflective coating. In a subsequent baking step, in the exposed regions the polymer of the antireflective coating with the crosslinked sites comprising acid labile groups (such as acid labile acetal groups), the acid labile groups are decrosslinked in the presence of the photogenerated acid, thus making the polymer and hence the antireflective coating soluble in the aqueous alkaline developer. A subsequent developing step with an aqueous alkaline developer then dissolves the exposed regions of both the positive photoresist and the antireflective coating, thus producing a positive image, and leaving the substrate clear for further processing. The novel composition functions as a developable bottom antireflective coating composition.

In another embodiment of the invention, the present invention relates to an antireflective coating composition comprising a polymer comprising a crosslinkable group and a chromophore, a crosslinker and the novel additive. In this embodiment the coating is baked to form a crosslinked coating which is not removed by an aqueous alkaline developer used to image and pattern the photoresist film. This novel coating is removed by dry etching using gas(es) in a dry etching chamber. No acid labile groups are formed between the polymer and the crosslinker. A photoresist coating is formed over the antireflective coating film and imagewise exposed and developed. No pattern is formed in the antireflective coating film during the aqueous alkaline development process.

The antireflective coating compositions of the present invention comprise a polymer, a crosslinker, and a novel aminium additive having structure (1) and where the ammonium assistive comprises an hydroxylaryl or arylene-hydroxyl moiety, where herein arylene-hydroxyl refers to Ar—(OH)m, where m=1, 2, or 3,

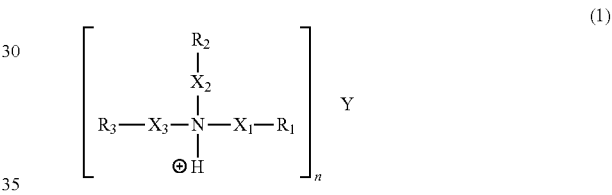

where Ar is a 1-4 aromatic group (arylene) (such as a divalent phenyl, naphthyl, anthracyl, etc); Y is chosen from the group consisting of carboxylate and sulfonate anions (such as those having the structures (2) and (3)); $R_1$, $R_2$, and $R_3$ are independently selected from unsubstituted $C_1$-$C_8$ alkyl, substituted $C_1$-$C_8$ alkyl, aryl and arylene-hydroxyl; $R_4$ is selected from a group consisting of unsubstituted $C_1$-$C_8$ alkyl, substituted $C_1$-$C_8$ alkyl, aryl, unsubstituted $C_1$-$C_8$ alkylene, substituted $C_1$-$C_8$ alkylene, arylene, arylene-hydroxyl and mixtures thereof; $X_1$, $X_2$, $X_3$ and $X_4$ are independently selected from direct valence bond and $C_1$-$C_8$ alkylene (substituted or unsubstituted) group, n=1, 2 or 3, and where at least one arylene-hydroxyl moiety is present in the additive.

In one embodiment, $R_1$, $R_2$, $R_3$, and $R_4$ are independently selected from a $C_1$-$C_8$ unsubstituted or substituted (such heterogroups like fluoro, chloro, nitro, cyano, hydroxyl, alkoxy) alkyl group, an arylene-hydroxyl moiety containing 1 to 3 aromatic rings (such as shown in structures 4, 5 and 6, where m=1, 2 or 3), an aryl moiety (such as shown in structures 7, 8 or 9); $R_4$ may also be a substituted or unsubstituted alkylene or substituted or unsubstituted arylene moiety when n=2 or 3; $X_1$, $X_2$, $X_3$ and $X_4$ represent either a direct valence bond or a $C_1$-$C_8$ alkylene group; and n=1, 2, 3 so that the number of ammonium ions equals the number of acid moieties.

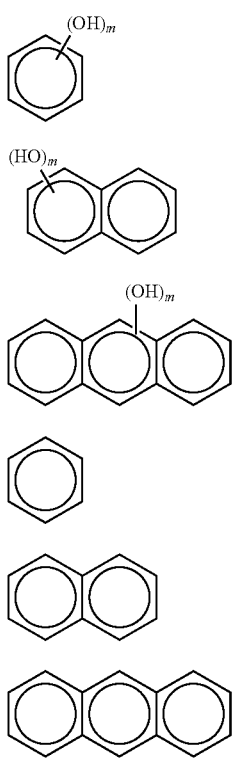

The arylene-hydroxy (Ar—(OH)$_m$, where m=1, 2 or 3) moiety may be present in at least one of $R_1$, $R_2$, $R_3$, and not on $R_4$. The arylene-hydroxy moiety may be present in $R_4$ and not in $R_1$, $R_2$, $R_3$, The arylene-hydroxy moiety may be present in at least one of $R_1$, $R_2$, $R_3$, and also in $R_4$. Thus, the arylene-hydroxy group may be present only in the anion, only in the cation or in both the anion and cation. The arylene-hydroxy moiety is at least one hydroxyl group attached to an aromatic structure arylene (Ar) such as phenyl, naphthyl, anthracyl etc, and the aromatic structure maybe further substituted by $C_1$-$C_8$ alkyl groups. Up to 3 hydroxyl groups may be attached to an arylene group. Generally, the additive aids in the crosslinking of the polymer and the crosslinker.

In an embodiment where the novel antireflective coating is dry etched, the additive of structure (1), where Y is of structure (3) may be used. Further embodiments of the aminium sulfonate are given herein.

In another embodiment of the sulfonate additive, the additive may be represented by structure (10)

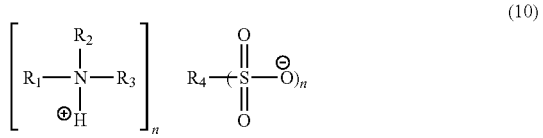

where n and $R_1$, $R_2$, $R_3$, and $R_4$ are as described above, where at least one of $R_1$, $R_2$, $R_3$, and $R_4$ is an arylene-hydroxy group.

Another embodiment of the additive is where the additive is a sulfonate salt having structure 1 where Y is structure 3, has n=1, $X_1$, $X_2$, $X_3$, and $X_4$ are direct valence bonds, $R_1$ is equal to structure (4) with m=1, $R_2$ and $R_3$ are selected independently from a group consisting of $C_1$-$C_8$ alkyl group, and $R_4$ is structure 4 with m=1 and only one sulfonate group is present (n=1). The novel additive may also be represented by structure (11),

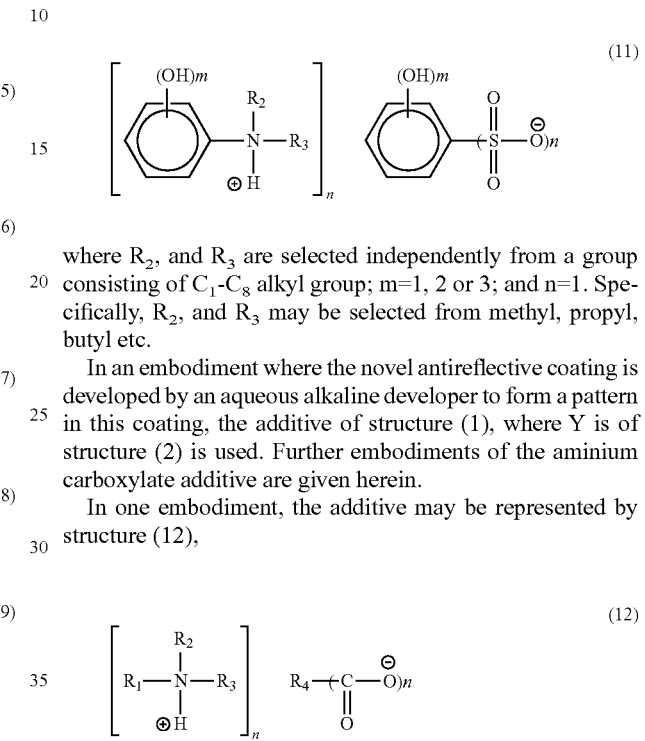

where $R_2$, and $R_3$ are selected independently from a group consisting of $C_1$-$C_8$ alkyl group; m=1, 2 or 3; and n=1. Specifically, $R_2$, and $R_3$ may be selected from methyl, propyl, butyl etc.

In an embodiment where the novel antireflective coating is developed by an aqueous alkaline developer to form a pattern in this coating, the additive of structure (1), where Y is of structure (2) is used. Further embodiments of the aminium carboxylate additive are given herein.

In one embodiment, the additive may be represented by structure (12), where n and $R_1$, $R_2$, $R_3$, and $R_4$ are as described above, where at least one of $R_1$, $R_2$, $R_3$, and $R_4$ is an arylene-hydroxy group.

Another embodiment of the additive is where the additive is an aminium carboxylate salt of structure 1 where Y is structure 2; has n=1-3; $X_1$, $X_2$, $X_3$, and $X_4$ are direct valence bonds, $R_1$ is equal to structure 4 with m=1, $R_2$ and $R_3$ are selected independently from a group consisting of $C_1$-$C_8$ alkyl group, and $R_4$ is structure 4 with m=1. In one case only one carboxyl group is present (n=1). As an example, the novel additive may be represented by structure (13),

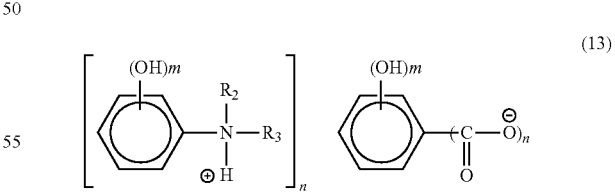

where, $R_2$, and $R_3$ are selected independently from a group consisting of $C_1$-$C_8$ alkyl group, m=1, 2 or 3; and n=1. Specifically, $R_2$, and $R_3$ may be selected from methyl, propyl, butyl etc.

In yet another embodiment of the additive, it may be of structure (10) where $R_1$, $R_2$, and $R_3$, are independently selected from a $C_1$-$C_8$ alkyl group, an arylene-hydroxyl moiety containing 1 to 3 aromatic rings (such as shown in structures (4), (5) and (6) where m=1, 2 or 3) and an aryl moiety (such as shown in structures (7), (8) or (9)), and where at least one of $R_1$, $R_2$ and $R_3$ is an arylene-hydroxyl moiety which may be chosen from structures (4), (5) or (6), and $R_4$ is an arylene-hydroxyl moiety which may be chosen from structures (4), (5) or (6). Thus, both the cation and sulfonate containing anion contain an arylene-hydroxyl moiety.

In yet another embodiment of the additive it may be of structure (12) where $R_1$, $R_2$, and $R_3$, are independently selected from a $C_1$-$C_8$ alkyl group, an arylene-hydroxyl moiety containing 1 to 3 aromatic rings (such as shown in structures (4), (5) and (6) where m=1, 2 or 3) and an aryl moiety (such as shown in structures (7), (8) or (9)), and where at least one of $R_1$, $R_2$ and $R_3$ is an arylene-hydroxyl moiety which may be chosen from structures (4), (5) or (6), and $R_4$ is an arylene-hydroxyl moiety which may be chosen from structures (4), (5) or (6). Thus, both the cation and carboxylate containing anion contain an arylene-hydroxyl moiety.

In yet another embodiment of the additive, it may be of structure (10) where $R_1$, $R_2$, and $R_3$, are independently selected from a $C_1$-$C_8$ alkyl group, an aryl moiety (such as shown in structures (7), (8) or (9)), and $R_4$ is an arylene-hydroxyl moiety which may be chosen from structures (4), (5) or (6). Thus, the sulfonate ion comprises an arylene-hydroxyl moiety.

In yet another embodiment of the additive, it may be of structure (12) where $R_1$, $R_2$, and $R_3$, are independently selected from a $C_1$-$C_8$ alkyl group, an aryl moiety (such as shown in structures (7), (8) or (9)), and $R_4$ is an arylene-hydroxyl moiety which may be chosen from structures (4), (5) or (6). Thus, the carboxylate ion comprises an arylene-hydroxyl moiety.

FIG. 1 shows examples of the carboxylate additives. FIG. 2 shows examples of the sulfonate additives. Examples of the additive are triethylaminium 4-hydroxybenzenesulfonate, bis[tris(4-vinyloxyethoxyphenyl)sulfonium]perfluorobutane-disulfonate triethylaminium 4-hydroxyphenylacetate, trihexylaminium 4-hydroxyphenylacetate, triethylaminium 3-(4-hydroxyphenyl)propionate, 3-hydroxyphenyl-N,N-dimethylaminium 4-hydroxyphenylacetate, and bis(3-hydroxyphenyl-N,N-dimethylaminium)malonate.

Alkyl means linear or branched alkyl having the desirable number of carbon atoms and valence. The alkyl group is generally aliphatic and may be cyclic or acyclic (i.e. noncyclic). Suitable acyclic groups can be methyl, ethyl, n- or iso-propyl, n-, iso, or tert-butyl, linear or branched pentyl, hexyl, heptyl, octyl, decyl, dodecyl, tetradecyl and hexadecyl. Unless otherwise stated, alkyl refers to 1-10 carbon atom moieties. The cyclic alkyl groups may be mono cyclic or polycyclic. Suitable example of mono-cyclic alkyl groups include substituted cyclopentyl, cyclohexyl, and cycloheptyl groups. The substituents may be any of the acyclic alkyl groups described herein. Suitable bicyclic alkyl groups include substituted bicyclo[2.2.1]heptane, bicyclo[2.2.2]octane, bicyclo[3.2.1]octane, bicyclo[3.2.2]nonane, and bicyclo[3.3.2]decane, and the like. Examples of tricyclic alkyl groups include tricyclo[5.4.0.0.$^{2,9}$]undecane, tricyclo[4.2.1.2.$^{7,9}$]undecane, tricyclo[5.3.2.0.$^{4,9}$]dodecane, and tricyclo[5.2.1.0.$^{2,6}$]decane. As mentioned herein the cyclic alkyl groups may have any of the acyclic alkyl groups as substituents.

Alkylene groups are multivalent alkyl groups derived from any of the alkyl groups mentioned hereinabove. When referring to alkylene groups, these include an alkylene chain substituted with ($C_1$-$C_6$)alkyl groups in the main carbon chain of the alkylene group. Alkylene groups can also include one or more alkyne groups in the alkylene moiety, where alkyne refers to a triple bond. Essentially an alkylene is a divalent hydrocarbon group as the backbone. Accordingly, a divalent acyclic group may be methylene, 1,1- or 1,2-ethylene, 1,1-, 1,2-, or 1,3 propylene, 2,5-dimethyl-hexene, 2,5-dimethyl-hex-3-yne, and so on. Similarly, a divalent cyclic alkyl group may be 1,2- or 1,3-cyclopentylene, 1,2-, 1,3-, or 1,4-cyclohexylene, and the like. A divalent tricyclo alkyl groups may be any of the tricyclic alkyl groups mentioned herein above. A particularly useful tricyclic alkyl group in this invention is 4,8-bis(methylene)-tricyclo[5.2.1.0.$^{2,6}$]decane.

Aryl groups contain 6 to 24 carbon atoms including phenyl, tolyl, xylyl, naphthyl, anthracyl, biphenyls, bis-phenyls, trisphenyls and the like. These aryl groups may further be substituted with any of the appropriate substituents e.g. alkyl, alkoxy, acyl or aryl groups mentioned hereinabove. Similarly, appropriate polyvalent aryl groups, arylenes, may be used in this invention. Representative examples of divalent aryl groups include phenylenes, xylylenes, naphthylenes, biphenylenes, and the like.

The novel composition comprises a polymer, a crosslinker and the novel additive. The polymer may comprise a crosslinkable group. The polymer may comprise a crosslinkable group and a chromophore. The polymers may further comprise an acid labile group. Antireflective compositions where the novel additive may be used are described in the following US patents and patent applications and are incorporated herein by reference U.S. Pat. No. 7,824,837, US 2008/0090184, US 2010/0119972, US 2011/0086312 and U.S. application Ser. No. 12/944,420 filed Nov. 11, 2010.

In one embodiment of the invention, the coating is baked to form a crosslinked coating which is removed by dry etching but not removed by an aqueous alkaline developer used to image the photoresist. In this case, the present invention relates to an antireflective coating composition comprising a polymer comprising a crosslinkable group and a chromophore, a crosslinker and the novel additive. In this embodiment the coating is baked to form a crosslinked coating which is not removed by an aqueous alkaline developer used to image the photoresist. No acid labile groups are formed between the polymer and the crosslinker. The polymer may be a crosslinkable polymer. The crosslinkable polymer is one or mixture of polymers which comprise reactive groups which can crosslink with the polymer of the present invention. Nonlimiting examples of the various types of crosslinkable polymers would be ones which contain functionalities which crosslink, such as acids, alcohols, esters, ethers, etc. Particularly preferred are polymers containing hydroxyl groups, carboxylic acid groups, carboxylic esters, epoxy groups, urethanes and amides. Crosslinkable polymers, such as, copolymers of polyhydroxystyrene, poly(hydroxynaphthalene), poly(metha)crylates, polyarylates, polyesters, polyurethanes, and alkyd resins (aliphatic polyesters) may be used. Useful polymers are exemplified by poly(hydroxystyrene-methylmethacrylate), homopolymers and/or copolymers obtained by polymerization of at least one of the following monomers: styrene, hydroxystyrene, hydroxyethyl (meth)acrylate, hydroxypropyl(meth)acrylate, methyl (meth) acrylate, ethyl (meth)acrylate, (meth)acrylic acid, polymers described in U.S. Pat. No. 6,465,148, U.S. Pat. No. 5,733,714, U.S. Pat. No. 6,737,492, U.S. Pat. No. 6,187,506, U.S. Pat. No. 5,981,145 and US 2004/0101779, all of which are incorporated herein by reference.

Specific examples of crosslinkable polymers are poly(hydroxystyrene-styrene-methacrylate), poly(hydroxystyrene-styrene-methacrylate), poly(4-hydroxystyrene), and poly (pyromellitic dianhydride-ethylene glycol-propylene oxide). A variety of crosslinking agents can be used in the composition of the present invention. Any suitable crosslinking agents that can crosslink the crosslinkable polymer in the presence of an acid may be used. Examples, without limitation, of such crosslinking agents are resins containing melamines, methylols, glycoluril, polymeric glycolurils, benzoguanamine, urea, hydroxy alkyl amides, epoxy and epoxy amine resins, blocked isocyanates, and divinyl monomers. Monomeric melamines like hexamethoxymethyl melamine; glycolurils like tetrakis(methoxymethyl)glycoluril; and aromatic methylols, like 2,6 bishydroxymethyl p-cresol may be used. Crosslinking agents disclosed in US 2006/0058468 and incorporated herein by reference, where the crosslinking agent is a polymeric glycoluril obtained by reacting at least one glycoluril compound with at least one reactive compound containing at least one hydroxy group and/or at least one acid group may be used. The additive is any described herein.

In the embodiment where antireflective composition is a positive bottom photoimageable antireflective coating composition developable to form a pattern in this coating using an aqueous alkaline developer, the composition comprises the novel additive, a crosslinking agent and a polymer, where the polymer comprises at least one hydroxyl and/or a carboxyl group and/or at least one absorbing chromophore. The hydroxyl and/or a carboxyl group and the absorbing group may be in the same recurring unit or the polymer comprises at least one recurring unit with a hydroxyl and/or a carboxyl group and at least one recurring unit with an absorbing chromophore. The polymer useful for the present embodiment may comprise at least one unit with hydroxyl and/or carboxyl group and at least one unit with an absorbing chromophore. Examples of an absorbing chromophore are hydrocarbon aromatic moieties and heterocyclic aromatic moieties with from one to four separate or fused rings, where there are 3 to 10 atoms in each ring. Examples of monomers with absorbing chromophores that can be polymerized are vinyl compounds containing substituted and unsubstituted phenyl, substituted and unsubstituted anthracyl, substituted and unsubstituted phenanthryl, substituted and unsubstituted naphthyl, substituted and unsubstituted heterocyclic rings containing heteroatoms such as oxygen, nitrogen, sulfur, or combinations thereof, such as pyrrolidinyl, pyranyl, piperidinyl, acridinyl, quinolinyl. The substituents may be any hydrocarbyl group and may further contain heteroatoms, such as, oxygen, nitrogen, sulfur or combinations thereof. Examples of such groups are ($C_1$-$C_{12}$) alkylene, esters, ethers, etc. Other chromophores are described in U.S. Pat. No. 6,114,085, and in U.S. Pat. No. 5,652,297, U.S. Pat. No. 5,981,145, U.S. Pat. No. 6,187,506, U.S. Pat. No. 5,939,236, and U.S. Pat. No. 5,935,760, which may also be used, and are incorporated herein by reference. The monomers may be vinyl compounds, such as, vinyl ester compounds, vinyl ether compounds, vinyl aromatics, vinyl alkylenearomatic compounds, etc. The preferred chromophoric monomers are vinyl compounds of substituted and unsubstituted phenyl, substituted and unsubstituted anthracyl, and substituted and unsubstituted naphthyl; and more preferred monomers are styrene, hydroxystyrene, acetoxystyrene, vinyl benzoate, vinyl 4-tert-butylbenzoate, ethylene glycol phenyl ether acrylate, phenoxypropyl acrylate, N-methyl maleimide, 2-(4-benzoyl-3-hydroxyphenoxy)ethyl acrylate, 2-hydroxy-3-phenoxypropyl acrylate, phenyl methacrylate, phenol methacrylate, benzyl methacrylate, 9-anthracenylmethyl methacrylate, 9-vinylanthracene, 2-vinylnaphthalene, N-vinylphthalimide, N-(3-hydroxy)phenyl methacrylamide, N-(3-hydroxy-4-hydroxycarbonylphenylazo)phenyl methacrylamide, N-(3-hydroxyl-4-ethoxycarbonylphenylazo)phenyl methacrylamide, N-(2,4-d initrophenylaminophenyl) maleimide, 3-(4-acetoaminophenyl)azo-4-hydroxystyrene, 3-(4-ethoxycarbonylphenyl)azo- acetoacetoxy ethyl methacrylate, 3-(4-hydroxyphenyl)azo-acetoacetoxy ethyl methacrylate, tetrahydroammonium sulfate salt of 3-(4-sulfophenyl)azoacetoacetoxy ethyl methacrylate and equivalent structures. It is within the scope of this invention that any chromophore that absorbs at the appropriate exposure wavelength may be used alone or in combination with other chromophores. The substituents may be hydroxyl, alkyl, ester, ether, alkoxycarbonyl, fluoroalcohol, vinyloxyalkylene, etc.

For the polymer comprising at least one unit with a hydroxyl and/or a carboxyl group to provide alkaline solubility, and a crosslinking site, one function of the polymer is to provide a good coating quality and another is to enable the antireflective coating to change solubility during the imaging process. The hydroxyl or carboxyl groups in the polymer provide one of the components necessary for the solubility change. Examples of monomers which provide such a unit upon polymerization are without limitations, substituted or unsubstituted vinyl monomers containing a hydroxyl and or carboxyl group, such as acrylic acid, methacrylic acid, vinyl alcohol, hydroxystyrenes, hydroxyethyl methacrylate, hydroxypropyl methacrylate, N-(hydroxymethyl)acrylamide, 4-hydroxyphenyloxy methacrylate, 4-hydroxyphenyloxy acrylate, 5-hydroxynaphthyloxy methacrylate, 5-hydroxynaphthyloxy acrylate, vinyl monomers containing 1,1',2,2',3,3'-hexafluoro-2-propanol, although any monomer that makes the polymer alkali soluble and preferably water insoluble, may be used. The polymer may contain a mixture of to monomer units containing hydroxyl and/or carboxyl groups. Vinyl monomers containing the 1,1,1,3,3,3-hexafluoro-2-propanol group are represented by structures (14) to (19) and their substituted equivalents.

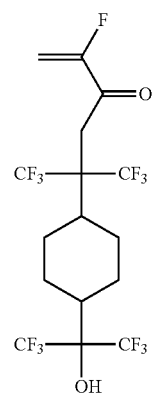

(14)

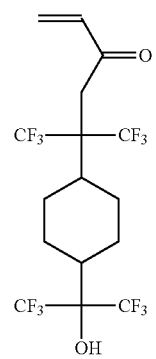

(15)

-continued

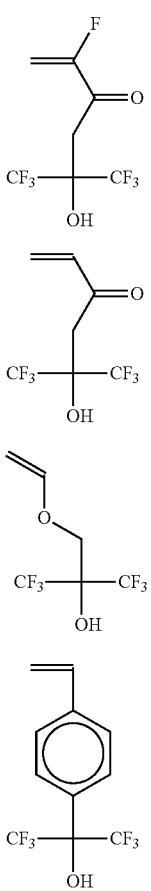

Thus a polymer may be synthesized by polymerizing monomers that contain a hydroxyl or carboxyl group with monomers that contain an absorbing chromophore. A skilled artisan will appreciate which chromophores are useful at the exposure wavelength of interest. Alternatively, the alkali soluble polymer may be reacted with compounds that provide the hydroxyl or carboxyl group and compounds that provide the absorbing chromophore. In the final polymer the mole % of the unit or units containing the hydroxyl or carboxyl group can range from 5 to 95, preferably 10 to 90, and more preferably 20 to 80 and the mole % of the absorbing chromophore unit in the final polymer can range from 5 to 95, preferably 10 to 90 more preferably 20 to 80. It is also within the scope of this invention that the hydroxyl or carboxyl group is attached to the absorbing chromophore or that the chromophore is attached to the hydroxyl or carboxyl group, that is, both groups are present in the same unit. As an example the chromophoric groups described previously may have pendant hydroxyl and/or carboxyl groups or that the chromophoric groups and the hydroxyl group and/or carbonyl group are attached to the same group.

In addition to the unit containing the hydroxyl and/or a carboxyl group and the absorbing chromphore, the polymer may contain other nonabsorbing monomeric units, such units may provide other desirable properties. A skilled artisan will appreciate which nonabsorbing monomeric units can be useful at the exposure wavelength of interest. Examples of the third monomer include —$CR_1R_2$—$CR_3R_4$—, where $R_1$ to $R_4$ are independently H, ($C_1$-$C_{10}$) alkyl, ($C_1$-$C_{10}$) alkoxy, nitro, halide, cyano, alkylaryl, alkenyl, dicyanovinyl, $SO_2CF_3$, COOZ, $SO_3Z$, COZ, OZ, $NZ_2$, SZ, $SO_2Z$, NHCOZ, $SO_2NZ_2$, where Z is H, or ($C_1$-$C_{10}$) alkyl, hydroxy ($C_1$-$C_{10}$) alkyl, ($C_1$-$C_{10}$alkylOCOCH_2COCH_3$, or $R_2$ and $R_4$ combine to form a cyclic group such as anhydride, pyridine, or pyrollidone, or $R_1$ to $R_3$ are independently H, ($C_1$-$C_{10}$) alkyl, ($C_1$-$C_{10}$) alkoxy and $R_4$ is a hydrophilic group. Examples of the hydrophilic group, are given here but are not limited to these $O(CH_2)_2OH$, $O(CH_2)_{20}(CH_2)OH$, $(CH_2)_nOH$ (where n=0-4), $COO(C_1$-$C_4)$ alkyl, COOX and $SO_3X$ (where X is H, ammonium, alkyl ammonium). Other hydrophilic vinyl monomers that can be used to form the polymer are acrylic acid, methacrylic acid, vinyl alcohol, maleic anhydride, maleic acid, maleimide, N-methyl maleimide, N-hydroxymethyl acrylamide and N-vinyl pyrrolidinone. Other monomers may be methyl methacrylate, butyl methacrylate, hydroxyethyl methacrylate and hydroxypropyl methacrylate. Monomeric units containing acid labile groups may also be used, such as hydroxystyrene, vinyl alcohol, (meth)acrylic acid capped with acid labile groups. Examples of acid labile groups, without limitation, are secondary and tertiary alkyls (up to 20 carbon atoms) with at least one β hydrogen, acetals and ketals, trimethylsilyl, and β-trimethylsilyl substituted alkyls. Representative examples of acid labile groups are tert-butyl, tert-pentyl, isobornyl, 1-alkylcyclohexyl, 1-alkylcyclopentyl, cyclohexyl, 2-alkyl-2-adamantyl, 2-alkyl-2-norbornyl. Other examples of acid labile groups are tetrahydrofuranyl, tetrahydropyranyl, substituted or unsubstituted methoxycarbonyl, β-trialkylsilylalkyl groups (e.g. $CH_2$—$CH_2Si(CH_3)_3$, $CH(-CH_2Si(CH_3)_3)_2$, $CH_2$—$CH(Si(CH_3)_3)_2$) and the like.

Examples of monomers containing acid labile groups that can be used in the polymers include methacrylate ester of methyladamantane, methacrylate ester of mevalonic lactone, 3-hydroxy-1-adamantyl methacrylate, methacrylate ester of beta-hydroxy-gamma-butyrolactone, t-butyl norbornyl carboxylate, t-butyl methyl adamantyl methacrylate, methyl adamantyl acrylate, t-butyl acrylate and t-butyl methacrylate; t-butoxy carbonyl oxy vinyl benzene, benzyl oxy carbonyl oxy vinyl benzene; ethoxy ethyl oxy vinyl benzene; trimethyl silyl ether of vinyl phenol, and 2-tris(trimethylsilyl)silyl ethyl ester of methyl methacrylate.

Examples of the foregoing polymers are shown in FIG. 3.

The crosslinker useful in the novel photoimageable antireflective coating composition can be a vinyl ether terminated crosslinking agents, such as can be represented by the general structure (14):

wherein R is selected from ($C_1$-$C_{30}$) linear, branched or cyclic alkylene, substituted or unsubstituted ($C_6$-$C_{40}$) arylene, or substituted or unsubstituted ($C_7$-$C_{40}$) alicyclic hydrocarbon; and p≥2. It is believed that the terminal vinyl ether group reacts with the hydroxyl or carboxyl group of the polymer to give an acid labile acetal linkage. Examples of such vinyl ether terminated crosslinking agents include bis(4-vinyloxy butyl) adipate; tris(4-vinyloxybutyl)-1,2,5-cyclohexanetricarboxylate, bis(4-vinyloxy butyl) succinate; bis(4-vinyloxy butyl) isophathalate; bis(4-vinyloxymethyl cyclohexylmethyl) glutarate; tris(4-vinyloxy butyl) trimellitate; bis(4-vinyloxy methyl cyclohexyl methyl) terephthalate; bis(4-vinyloxy methyl cyclohexyl methyl) isophthalate; bis(4-vinyloxy butyl) (4-methyl-1,3-phenylene) biscarbamate; bis(4-vinyloxy butyl) (methylene di-4,1-phenylene) biscarbamate; and triethyleneglycol divinylether, 1,4-cyclohexanedimentanol divinyl ether, various Vectomer® vinyl ether monomers supplied by Aldrich Company, and polymers bearing pendant vinyloxy groups. Other vinyl ether terminated crosslinking agents are described in T. Yamaoka, et al., Trends in Photochem. Photobio., 7:45 (2001); S. Moon, et al., Chem. Mater., 6:1854 (1994); or H. Schacht, et al., ACS Symp. Ser. 706:78 (1998) which may also be used, and are incorporated herein by reference. Vinyl ether crosslinkers crosslink with the polymer to provide an acid labile structure which is capable of being decrosslinked in the presence of an acid, which are particularly useful for photoimageable antireflective coating compositions.

The vinyl ether terminated crosslinking agent is added to the antireflective coating in a proportion which provides 0.20-2.00 mol equivalents of vinyl ether crosslinking function per reactive group on the polymer, or 0.50-1.50 reactive equivalents per reactive group.

In one embodiment where the antireflective coating composition comprises a an optional photoacid generator, the photoacid generator in the antireflective coating and the photoacid generator in the photoresist, are sensitive to the same wavelength of light, and thus the same radiant wavelength of light can cause an acid to be formed in both layers. The acid in the exposed areas of the antireflective coating, present either through diffusion from the photoresist or through photogeneration from the photoacid generator in the antireflective film, reacts with the acid labile crosslinkages to decrosslink the polymer, thus making the exposed areas of the antireflective coating soluble in the aqueous alkaline developer. The photoacid generator of the antireflective coating chosen depends on the photoresist to be used. The photoacid generator (PAG) of the novel composition is selected from those which absorb at the desired exposure wavelength, preferably 248 nm, 193 nm and 157 nm for deep ultraviolet photoresists, 13.5 nm for extreme ultraviolet, and naphthoquinone diazides or sulfonium salts for 365 nm, 436 nm and broadband photoresists. Suitable examples of the acid generating photosensitive compounds include, without limitation, ionic photoacid generators (PAG), such as diazonium salts, iodonium salts, sulfonium salts, or non-ionic PAGs such as diazosulfonyl compounds, sulfonyloxy imides, and nitrobenzyl sulfonate esters, although any photosensitive compound that produces an acid upon irradiation may be used. The onium salts are usually used in a form soluble in organic solvents, mostly as iodonium or sulfonium salts, examples of which are diphenyliodonium trifluoromethane sulfonate, diphenyliodonium nonafluorobutane sulfonate, triphenylsulfonium trifluoromethane sulfonate, triphenylsulfonium nonafluorobutane sulfonate and the like. Other compounds that form an acid upon irradiation that may be used, are triazines, oxazoles, oxadiazoles, thiazoles, substituted 2-pyrones. Phenolic sulfonic esters, bis-sulfonylmethanes, bis-sulfonylmethanes or bis-sulfonyldiazomethanes, triphenylsulfonium tris(trifluoromethylsulfonyl)methide, triphenylsulfonium bis(trifluoromethylsulfonyl)imide, diphenyliodonium tris(trifluoromethylsulfonyl)methide, diphenyliodonium bis(trifluoromethylsulfonyl)imide and their homologues are also possible candidates. Mixtures of photoactive compounds may also be used. In one embodiment the antireflective coating composition comprises an optional photoacid generator which comprises vinyl ether groups, which can act as a crosslinker reacting with hydroxyl moieties. Examples of such crosslinkers are given in US 2010/0119972.

The solvent for the antireflective coating is chosen such that it can dissolve all the solid components of the antireflective coating. Examples of suitable solvents for the antireflective coating composition are cyclohexanone, cyclopentanone, anisole, 2-heptanone, ethyl lactate, propylene glycol monomethyl ether acetate, propylene glycol monomethyl ether, butyl acetate, gamma butyroacetate, ethyl cellosolve acetate, methyl cellosolve acetate, methyl 3-methoxypropionate, ethyl pyruvate, 2-methoxybutyl acetate, diacetone alcohol, diethyl carbonate, 2-methoxyethyl ether, but ethyl lactate, propylene glycol monomethyl ether acetate, propylene glycol monomethyl ether or mixtures thereof are preferred. Solvents with a lower degree of toxicity and good coating and solubility properties are generally preferred.

The composition of the present invention may further comprise an additional additive such as thermal acid generator which does not contain any hydroxyarylene moieties. Any known thermal acid generators may be used, exemplified without limitations, by 2,4,4,6-tetrabromocyclohexadienone, benzoin tosylate, squaric acid, 2-nitrobenzyl tosylate, chloroacetic acid, toluenesulfonic acid, methanesulfonic acid, nonaflate acid, triflic acid, other alkyl esters of organic sulfonic acids, salts of these mentioned acids. The thermal acid generator may be a component that releases an acid of moderate acidity, i.e. with a pKa ($-\log_{10}$ of the acid dissociation constant) greater than 1.0. For photoimageable antireflective coating compositions, a thermal acid generator that releases acids with a pKa of less than 5.0 and greater than 1.0 are also preferred. Examples, without limitations, of acids or acids derived from thermal acid generators with moderate acidity are maleic acid (pKa of 1.83), chloroacetic acid (pKa of 1.4), dichloroacetic acid (pKa of 1.48), oxalic acid (pKa of 1.3), cinnamic acid (pKa of 4.45), tartaric acid (pKa of 4.3), gylcolic acid (pKa of 3.8), fumaric acid (pKa of 4.45), malonic acid (pKa of 2.8), cyanoacetic acid (pKa of 2.7), etc. Acids which are blocked by bases to form a thermal acid generator are preferred. Acids, such as those described above, may be blocked with bases such as amines. Typical bases are triethyl amine, tripropyl amine, trimethyl amine, tributyl amine, tripentyl amine, tridodecyl amine etc. Additionally, diaryl or trialkyl sulfonium salts with anions of weak acids, such as carboxylic acid or aryl carboxylic acid may be used. Acids which are blocked by bases may be formed by combining the acid with a base, where the acid:base ratio ranges from about 1:1 to about 1:3. The additives may be present in the antireflective composition at levels ranging from 0.1 to 25 weight % of solids, especially 0.1 to about 5 weight %. In an embodiment where the antireflective coating is irreversibly crosslinked and must be dry etched, thermal acid generators that release acids with a pKa of less than 1.0 are also preferred. Examples, without limitations, of acids or acids derived from thermal acid generators with strong acidity are toluenesulfonic acid, octanesulfonic acid, triflic acid, perfluorobutanesulfonic acid etc. Acids which are blocked by bases to form a thermal acid generator are preferred. Acids, such as those described above, may be blocked with bases such as amines. Typical bases are triethyl amine, tripropyl amine, trimethyl amine, tributyl amine, tripentyl amine, tridodecyl amine etc. Additionally, diaryl or trialkyl sulfonium salts with anions of strong acid, such as arylsulfonic acid, alkyl sulfonic acid or perfluoroalkyl sulfonic acid may be used. Acids which are blocked by bases may be formed by combining the acid with a base, where the acid:base ratio ranges from about 1:1 to about 1:3. The additives may be present in the antireflective composition at levels ranging from 0.1 to 25 weight % of solids, especially 0.1 to about 5 weight %.

The antireflective coating compositions of the present invention may comprise up to about 15 percent by weight of the solids, preferably less than 8 percent, based on the total weight of the coating composition. The solids may comprise from 1 to 15 weight percent of the novel additive having structure 1, 0.5 to 25 weight percent of the optional photoacid generator, 0.5 to 25 weight percent of the optional crosslinking photoacid generators, 50 to 99 weight percent of polymer, 1 to 50 weight percent of the crosslinking agent and optionally 0.1 to 10 weight percent of additional thermal acid generator, based on the total solids content of the antireflective coating composition. Preferably the photoacid generator level ranges from about 0.01 to about 20 weight %. Preferably the novel additive ranges from about 0.1 to 10 weight percent of the total solids, the crosslinking agent ranges from about 5 to about 40 weight percent or 10 to 35 weight percent of the total solids. The solid components are dissolved in the solvent, or mixtures of solvents, and filtered to remove impurities. The components of the antireflective coating may also be treated by techniques such as passing through an ion exchange column, filtration, and extraction process, to improve the quality of the product.

Other components may be added to the antireflective composition of the present application in order to enhance the performance of the coating, e.g. lower alcohols, dyes, surface leveling agents, adhesion promoters, antifoaming agents, etc. These additives may be present at up to 30 weight percent level. Other polymers, such as, novolaks, polyhydroxystyrene, polymethylmethacrylate and polyarylates, may be added to the composition, providing the performance is not negatively impacted. Preferably the amount of this polymer is kept below 50 weight % of the total solids of the composition, more preferably 35 weight %, and even more preferably below 20 weight %. Bases may also be added to the composition to enhance stability. Both photobases and nonphotobases are known additives. Examples of bases are tetramethylammonium carboxylate salts, amines, ammonium hydroxide, and photosensitive bases. Particularly preferred bases are tetrabutylammonium hydroxide, triethanolamine, diethanol amine, trioctylamine, n-octylamine, trimethylsulfonium hydroxide, triphenylsulfonium hydroxide, bis(t-butylphenyl)iodonium cyclamate and tris(tert-butylphenyl)sulfonium cyclamate, tetramethylammonium deoxycholate, tetramethylammonium cholate, tetramethylammonium lithocholate and in general amine bases having a boiling point above 130° C.

The absorption parameter (k) of the novel composition ranges from about 0.1 to about 1.0, preferably from about 0.15 to about 0.7 as measured using ellipsometry. The refractive index (n) of the antireflective coating is also optimized. The n and k values can be calculated using an ellipsometer, such as the J. A. Woollam WVASE VU-302 ™ Ellipsometer. The exact values of the optimum ranges for k and n are dependent on the exposure wavelength used and the type of application. Typically for 193 nm the preferred range for k is 0.1 to 0.75, for 248 nm the preferred range for k is 0.15 to 0.8, and for 365 nm the preferred range is from 0.1 to 0.8. The thickness of the antireflective coating is less than the thickness of the top photoresist. For developable antireflective coatings the film thickness of the antireflective coating is less than the value of (wavelength of exposure/refractive index), and more preferably it is less than the value of (wavelength of exposure/2 times refractive index), where the refractive index is that of the antireflective coating and can be measured with an ellipsometer. The optimum film thickness of the antireflective coating is determined by the exposure wavelength, refractive indices of the antireflective coating and of the photoresist, absorption characteristics of the top and bottom coatings, and optical characteristics of the substrate. In this case, since the bottom antireflective coating is removed by exposure and development steps, the optimum film thickness is determined by avoiding the optical nodes where no light absorption is present in the antireflective coating.

The antireflective coating composition is coated on the substrate using techniques well known to those skilled in the art, such as dipping, spin coating or spraying. Various substrates known in the art may be used, such as those that are planar, have topography or have holes. Examples of semiconductor substrates are crystalline and polycrystalline silicon, silicon dioxide, silicon (oxy)nitride, aluminum, aluminum/silicon alloys, and tungsten. In certain cases there can be a buildup of photoresist film at the edges of the substrate, referred to as edge bead. This edge bead can be removed using a solvent or mixture of solvents using techniques well known to those of ordinary skill in the art. The composition of the present invention is particularly compatible with edge bead removers. Typical solvents used for edge bead removers are ethyl lactate, butyl acetate, propyleneglycol monomethyletheracetate, propyleneglycol monomethylether, or mixtures thereof. The coating is then cured. The preferred range of temperature is from about 120° C. to about 240° C. for about 30-120 seconds on a hot plate or equivalent heating unit, more preferably from about 150° C. to about 200° C. for 45-90 seconds. The film thickness of the antireflective coating ranges from about 20 nm to about 300 nm. The optimum film thickness is determined, as is well known in the art, to be where good lithographic properties are obtained, especially where no standing waves are observed in the photoresist. If has been unexpectedly found that for this novel composition very thin coatings can be used due to the excellent absorption and refractive index properties of the film. The cured antireflective coating is also insoluble at this stage in the alkaline developing solution. The photoresist can then be coated on top of the antireflective coating.

Positive photoresists, which are developed with aqueous alkaline solutions, are useful for the present invention, provided the photoactive compounds in the photoresist and the antireflective coating absorb at the same exposure wavelength used for the imaging process for the photoresist. Positive-working photoresist compositions are exposed image-wise to radiation, those areas of the photoresist composition exposed to the radiation become more soluble to the developer solution while those areas not exposed remain relatively insoluble to the developer to solution. Thus, treatment of an exposed positive-working photoresist with the developer causes removal of the exposed areas of the coating and the formation of a positive image in the photoresist coating. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the drive toward miniaturization reduces the critical dimensions on the devices.

Photoresists can be any of the types used in the semiconductor industry, provided the photoactive compound in the photoresist and the antireflective coating absorb at the exposure wavelength used for the imaging process.

To date, there are several major deep ultraviolet (uv) exposure technologies that have provided significant advancement in miniaturization, and these radiation of 248 nm, 193 nm, 157 and 13.5 nm. Photoresists for 248 nm have typically been based on substituted polyhydroxystyrene and its copolymers/onium salts, such as those described in U.S. Pat. No. 4,491,628 and U.S. Pat. No. 5,350,660. On the other hand, photoresists for exposure below 200 nm require non-aromatic polymers since aromatics are opaque at this wavelength. U.S.

Pat. No. 5,843,624 and U.S. Pat. No. 6,866,984 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon to hydrogen ratios which improve etch resistance, they also provide transparency at low wavelengths and they have relatively high glass transition temperatures. U.S. Pat. No. 5,843,624 discloses polymers for photoresist that are obtained by free radical polymerization of maleic anhydride and unsaturated cyclic monomers. Any of the known types of 193 nm photoresists may be used, such as those described in U.S. Pat. No. 6,447,980 and U.S. Pat. No. 6,723,488, and incorporated herein by reference.

Two basic classes of photoresists sensitive at 157 nm, and based on fluorinated polymers with pendant fluoroalcohol groups, are known to be substantially transparent at that wavelength. One class of 157 nm fluoroalcohol photoresists is derived from polymers containing groups such as fluorinated-norbornenes, and are homopolymerized or copolymerized with other transparent monomers such as tetrafluoroethylene (U.S. Pat. No. 6,790,587, and U.S. Pat. No. 6,849,377) using either metal catalyzed or radical polymerization. Generally, these materials give higher absorbencies but have good plasma etch resistance due to their high alicyclic content. More recently, a class of 157 nm fluoroalcohol polymers was described in which the polymer backbone is derived from the cyclopolymerization of an asymmetrical diene such as 1,1,2,3,3-pentafluoro-4-trifluoromethyl-4-hydroxy-1,6-heptadiene (Shun-ichi Kodama et al Advances in Resist Technology and Processing XIX, Proceedings of SPIE Vol. 4690 p 76 2002; U.S. Pat. No. 6,818,258) or copolymerization of a fluorodiene with an olefin (U.S. Pat. No. 6,916,590). These materials give acceptable absorbance at 157 nm, but due to their lower alicyclic content as compared to the fluoro-norbornene polymer, have lower plasma etch resistance. These two classes of polymers can often be blended to provide a balance between the high etch resistance of the first polymer type and the high transparency at 157 nm of the second polymer type. Photoresists that absorb extreme ultraviolet radiation (EUV) of 13.5 nm are also useful and are known in the art.

A film of photoresist is then coated on top of the cured antireflective coating and baked to substantially remove the photoresist solvent.

The photoresist is imagewise exposed to actinic radiation and then developed to form an image in the photoresist pattern, without transferring the pattern into the antireflective coating film. In this embodiment dry etching is used to remove the novel antireflective film.

In the embodiment of the photoimageable antireflective coating, the photoresist and the antireflective coating bilevel layers are then imagewise exposed to actinic radiation. In a subsequent heating step the acid generated during exposure step reacts to de-crosslink the polymer of the antireflective coating composition and thus rendering the exposed region of the antireflective coating alkali soluble in the developing solution. The temperature for the postexposure bake step can range from 40° C. to 200° C. for 30-200 seconds on a hot plate or equivalent heating system, preferably from 80° C. to 160° C. for 40-90 seconds. In some instances, it is possible to avoid the postexposure bake, since for certain chemistries, such as some acetal acid labile linkages, deprotection proceeds at room temperature. The polymer in the exposed regions of the antireflective coating is now soluble in an aqueous alkaline solution. The bilevel system is then developed in an aqueous alkaline developer to remove the photoresist and the antireflective coating. The developer is preferably an aqueous alkaline solution comprising, for example, tetramethyl ammonium hydroxide. The developer may further comprise additives, such as surfactants, polymers, isopropanol, ethanol, etc. The process of coating and imaging photoresist coatings and antireflective coatings is well known to those skilled in the art and is optimized for the specific type of photoresist and antireflective coating combination used. The imaged bilevel system can then be processed further as required by the manufacturing process of integrated circuits, for example metal deposition and etching.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The absorption parameter (k) and the refractive index (n) were measured using variable angle spectrophotometric ellipsometry. The bottom antireflective coating (B.A.R.C.) solutions were spin coated on primed silicon wafers and baked to get a given film thickness. The coated wafers were then measured using an ellipsometer manufactured by J. A. Woollam or Sopra Corporation. The obtained data were fitted to get the k and n values of the B.A.R.C. films.

Polymers were obtained by radical polymerization using the general procedure outlined in US 2011/0076626. The number in the parenthesis for each polymer represents the molar feed ratio of monomers used when employing this procedure.

The number in parenthesis after a polymer's name which consists of the acronyms for the constituent monomers separated by a slash represents the molar feed ratio of monomers used when it was made. The PAG, and bis[tris(4-vinyloxy-ethoxyphenyl)sulfonium]perfluorobutanedisulfonate described in these examples was obtained by the procedure described in US 2010/0119972.

Below are the structures associated with the acronyms of each of the monomers employed to make the polymers of the examples below.

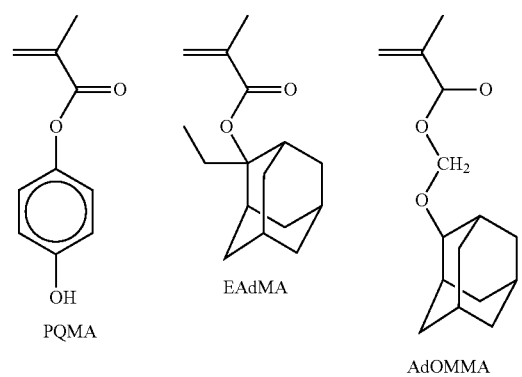

The photoresist used was any one of commercially available 193 nm or 248 nm photoresist sold by vendors such as Sumitomo Chemical, Tokyo Ohka and Japan Synthetic Rubber.

The solvent used as a prewet solvent for photoresist coating is any of PGMEA, PGME, ethyl lactate, cyclohexane, n-butyl acetate, γ-butyrolactone and mixture thereof.

Synthesis Example 1

1.52 g of 4-hydroxyphenylacetic acid was dissolved in 40.37 g of propylene glycol mono methylether (PGME). To the above PGME solution, 2.96 g of trihexylamine was added and mixed.

The solution was heated at 40° C. under reduced pressure using a rotary evaporator and the product was isolated. H-NMR spectrum showed N+CH$_2$ proton at 3.5 ppm. Proton of free carboxyl group was not observed and formation of carboxylic acid salt was confirmed.

Synthesis Examples 2-15

Table 1 lists examples 1-15 which were all the salts which were made as stock solutions in PGME and used in the formulation examples. These were reacted in the same manner as shown above, but leaving the materials in PGME as stock solutions to be used in the above described formulation examples.

Formulation and Exposure Example 1

PQMA/EAdMA (60/40) copolymer (0.2218 g), tris(vinyloxybutyl)cyclohexane 1,2,4-tricarboxylate (0.0665 g), triethylaminium 4-hydroxyphenylacetate (0.0670 g) and bis[tris(4-vinyloxyethoxyphenyl)sulfonium] perfluorobutanedisulfonate (0.0047 g) were dissolved in a mixture of 13.57 g of propyleneglycol monomethylether, 5.81 g of propyleneglycol monomethylether acetate and 0.241 g of γ-valerolactone to form a antireflective composition (B.A.R.C.) solution. The solution was filtered through a 0.2 μm micron filter.

The B.A.R.C. solution was coated on a silicon wafer and heated on a hotplate at 190° C. for 60 seconds to give a film thickness of 400 Å. The absorption (k) value was 0.38 and the refractive index (n) value was 1.726 at 193 nm. The B.A.R.C. wafer was prewet with a solvent and coated with 193 nm photoresist and heated on a hotplate for 110° C. for 60 seconds to give a film thickness of 140 nm. The coated wafer was exposed using Nikon 306D 193 nm scanner for imagewise exposure through a mask. The exposed wafer was then post exposure baked for 60 seconds at 110° C. and followed with a 30 second puddle development at 23° C. using of AZ® 300 MIF Developer (2.38 wt % TMAH aqueous solution available from AZ Electronic Materials USA Corp., 70 Meister Ave., Somerville N.J.). Using a Scanning Electron Microscope (SEM), 125 nm photoresist/B.A.R.C. Lines (1:1) were obtained with clean pattern for resist and clean trench spaces

TABLE 1

| Synth. Ex | Carboxylic acid | Amine | Solvent |
|---|---|---|---|
| 1 | 4-hydroxyphenyl acetic acid (1.52 g) | Trihexylamine (2.96 g) | PGME (40.37 g) |
| 2 | 4-hydroxyphenyl acetic acid (1.52 g) | Triethylamine (1.11 g) | PGME (23.71 g) |
| 3 | 4-hydroxyphenyl acetic acid (1.52 g) | 3-(dimethylamino)phenol (1.51 g) | PGME (27.27 g) |
| 4 | 4-hydroxyphenyl acetic acid (1.52 g) | 3-(diethylamino)phenol (1.82 g) | PGME (30.05 g) |
| 5 | Malonic acid (1.04 g) | 3-(dimethylamino)phenol (3.01 g) | PGME (36.52 g) |
| 6 | Malonic acid (1.04 g) | 3-(diethylamino)phenol (3.64 g) | PGME (42.08 g) |
| 7 | 4-(4-hydroxyphenyl)benzoic acid (1.07 g) | Trihexylamine (1.48 g) | PGME (21.77 g) |
| 8 | 2-(4-hydroxylphenoxy)propionic acid (0.91 g) | Trihexylamine (1.48 g) | PGME (20.33 g) |
| 9 | 4-hydroxybenzoic acid (0.69 g) | Trihexylamine (1.48 g) | PGME (18.34 g) |
| 10 | 3-(4-hydroxyphenyl)propionic acid (1.66 g) | Trihexylamine (2.96 g) | PGME (39.21 g) |
| 11 | 3-(4-hydroxyphenyl)propionic acid (1.66 g) | Triethylamine (1.11 g) | PGME (24.97 g) |
| 12 | Malonic acid (1.04 g) | 4-hydroxyphenylethylamine (3.02 g) | PGME (36.52 g) |
| 13 | 4-hydroxyphenyl acetic acid (1.52 g) | 4-hydroxyphenylethylamine (3.02 g) | PGME (27.27 g) |
| 14 | 4-hydroxybenzenesulfonic acid (1.833 g) | Triethylamine (1.113 g) | PGME (24.82 g) |
| 15 | 4-hydroxybenzenesulfonic acid (1.833 g) | 3-(dimethylamino)phenol (1.5089 g) | PGME (28.015 g) |
| Comp 16 | Malonic acid (1.73 g) | Triethylamine (1.11 g) | PGME (22.27 g) |
| Comp 17 | Phenyl acetic acid (1.36 g) | 4-hydroxyphenylethylamine (3.02 g) | PGME (27.27 g) |
| Comp 18 | Terephthalic acid (1.66 g) | Triethylamine (2.22 g) | PGME (34.98 g) |
| Comp 19 | 3,4-cyclohexanediacrboxylic acid (1.72 g) | Triethylamine (2.22 g) | PGME (35.53 g) | with complete opening of the B.A.R.C. pattern at a dose of 20.0 mJ/cm². Pattern collapse was not observed up to and including 26 mJ/cm².

Formulation and Exposure Example 2

PQMA/EAdMA (60/40) copolymer (0.197 g), tris(vinyloxybutyl)cyclohexane 1,2,4-tricarboxylate (0.0579 g), trihexylaminium 4-hydroxyphenylacetate (0.0991 g) and bis[tris(4-vinyloxyethoxyphenyl)sulfonium] perfluorobutanedisulfonate (0.0058 g) were dissolved in a mixture of 13.57 g of propyleneglycol monomethylether, 5.81 g of propyleneglycol monomethylether acetate and 0.241 g of γ-valerolactone to form a antireflective composition (B.A.R.C. solution). The solution was filtered through a 0.2 µm micron filter.

The B.A.R.C. solution was coated on a silicon wafer and heated on a hotplate at 190° C. for 60 seconds to give a film thickness of 400 Å. The absorption (k) value was 0.387 and the refractive index (n) value was 1.728 at 193 nm. The B.A.R.C. wafer was prewet with a solvent and coated with 193 nm photoresist heated on a hotplate for 130° C. for 60 seconds to give a film thickness of 140 nm. The coated wafer was exposed using Nikon 306D 193 nm scanner for imagewise exposure. The exposed wafer was then post exposure baked for 60 seconds at 105° C. and followed with a 30 second puddle development at 23° C. using of AZ® 300 MIF Developer. Using a Scanning Electron Microscope (SEM), 125 nm photoresist/B.A.R.C. Lines (1:1) were obtained with clean pattern for resist and clean trench spaces with complete opening of the B.A.R.C. pattern at a dose of 23.0 mJ/cm². Pattern collapse was not observed up to and including 27 mJ/cm².

Formulation and Exposure Example 3

PQMA/EAdMA (60/40) copolymer (0.658 g), tris(vinyloxybutyl)cyclohexane 1,2,4-tricarboxylate (0.198 g), triethylaminium 3-(4-hydroxyphenyl)propionate (0.210 g) and bis[tris(4-vinyloxyethoxyphenyl)sulfonium]perfluorobutanedisulfonate (0.0139 g) were dissolved in a mixture of 40.73 g of propyleneglycol monomethylether, 17.45 g of propyleneglycol monomethylether acetate and 0.724 g of γ-valerolactone to form a antireflective composition (B.A.R.C. solution). The solution was filtered through a 0.2 µm micron filter.

The B.A.R.C. solution was coated on a silicon wafer, and processed as described in Formulation and Exposure Example 2. Using a scanning electron microscope (SEM), 125 nm photoresist/B.A.R.C. Lines (1:1) were obtained with clean pattern for resist and clean trench spaces with complete opening of the B.A.R.C. pattern at a dose of 23.0 mJ/cm². Pattern collapse was not observed up to and including 27.0 mJ/cm².

Formulation and Exposure Example 4

PQMA/EAdMA (60/40) copolymer (0.658 g), tris(vinyloxybutyl)cyclohexane 1,2,4-tricarboxylate (0.193 g), triethylaminium 3-(4-hydroxyphenyl)propionate (0.210 g) and bis[tris(4-vinyloxyethoxyphenyl)sulfonium]perfluorobutanedisulfonate (0.0194 g) were dissolved in a mixture of 40.74 g of propyleneglycol monomethylether, 17.45 g of propyleneglycol monomethylether acetate and 0.724 g of γ-valerolactone to form a antireflective composition (B.A.R.C. solution). The solution was filtered through a 0.2 µm micron filter.

The B.A.R.C. solution was coated on a silicon wafer, and processed as described in Formulation and Exposure Example 2. Using a scanning electron microscope (SEM), 125 nm photoresist/B.A.R.C. Lines (1:1) were obtained with clean pattern for resist and clean trench spaces with complete opening of the B.A.R.C. pattern at a dose of 23.0 mJ/cm2. Pattern collapse was not observed up to and including 27.0 mJ/cm².

Formulation and Exposure Example 5

PQMA/AdOMMA/EAdMA (55/20/25) terpolymer (0.146 g), tris(vinyloxybutyl)cyclohexane 1,2,4-tricarboxylate (0.045 g), trihexylaminium 4-hydroxyphenylacetate (0.076 g) and bis[tris(4-vinyloxyethoxyphenyl)sulfonium]perfluorobutanedisulfonate (0.0031 g) were dissolved in a mixture of 13.64 g of propyleneglycol monomethylether, 5.85 g of propyleneglycol monomethylether acetate and 0.247 g of γ-valerolactone to form an antireflective composition (B.A.R.C. solution). The solution was filtered through a 0.2 µm micron filter.

The B.A.R.C. solution was coated on a silicon wafer, and processed as described in Formulation and Exposure Example 2. Using a scanning electron microscope (SEM), 125 nm photoresist/B.A.R.C. Lines (1:1) were obtained with clean pattern for resist and clean trench spaces with complete opening of the B.A.R.C. pattern at a dose of 23.0 mJ/cm². Pattern collapse was not observed up to and including 27.0 mJ/cm²

Formulation and Exposure Example 6

PQMA/AdOMMA/EAdMA (55/20125) terpolymer (0.164 g), tris(vinyloxybutyl)cyclohexane 1,2,4-tricarboxylate (0.051 g), triethylaminium 4-hydroxyphenylacetate (0.051 g) and bis[tris(4-vinyloxyethoxyphenyl)sulfonium] perfluorobutanedisulfonate (0.0035 g) were dissolved in a mixture of 13.64 g of propyleneglycol monomethylether, 5.85 g of to propyleneglycol monomethylether acetate and 0.247 g of γ-valerolactone to form an antireflective composition (B.A.R.C. solution). The solution was filtered through a 0.2 µm micron filter.

The B.A.R.C. solution was coated on a silicon wafer, and processed as described in Formulation and Exposure Example 2. Using a scanning electron microscope (SEM), 125 nm photoresist/B.A.R.C. Lines (1:1) were obtained with clean pattern for resist and clean trench spaces with complete opening of the B.A.R.C. pattern of 23.0 mJ/cm². Pattern collapse was not observed up to and including 27.0 mJ/cm².

Formulation and Exposure Example 7

PQMA/EAdMA (60140) copolymer (0.2258 g), tris(vinyloxybutyl)cyclohexane 1,2,4-tricarboxylate (0.0634 g), 3-hydroxyphenyl-N,N-dimethylaminium 4-hydroxyphenylacetate (0.0745 g) and bis[tris(4-vinyloxyethoxyphenyl) sulfonium]perfluorobutanedisulfonate (0.0064 g) were dissolved in a mixture of 13.57 g of propyleneglycol monomethylether, 5.81 g of propyleneglycol monomethylether acetate and 0.241 g of γ-valerolactone to form an antireflective composition (B.A.R.C. solution). The solution was filtered through a 0.2 µm micron filter.

The B.A.R.C. solution was coated on a silicon wafer, and processed as described in Formulation and Exposure Example 1. Using a scanning electron microscope (SEM), 125 nm photoresist/B.A.R.C. Lines (1:1) were obtained with clean pattern for resist and clean trench spaces with complete opening of the B.A.R.C. pattern at a dose of 20.0 mJ/cm². Pattern collapse was not observed up to and including 27 mJ/cm².

Formulation and Exposure Example 8

PQMA/AdOMMA/EAdMA (55/20/25) terpolymer (0.171 g), tris(vinyloxybutyl)cyclohexane 1,2,4-tricarboxylate (0.050 g), bis(3-hydroxyphenyl-N,N-dimethylaminium)malonate (0.044 g) and bis[tris(4-vinyloxyethoxyphenyl)sulfonium]perfluorobutanedisulfonate (0.0050 g) were dissolved in mixture of 13.64 g of propyleneglycol monomethylether, 5.84 g of propyleneglycol monomethylether acetate and 0.25 g of γ-valerolactone to form an antireflective composition (B.A.R.C. solution). The solution was filtered through a 0.2 μm micron filter.

The B.A.R.C. solution was coated on a silicon wafer, and processed as described in Formulation and Exposure Example 2. Using a scanning electron microscope (SEM), 125 nm photoresist/B.A.R.C. Lines (1:1) were obtained with clean pattern for resist and clean trench spaces with complete opening of the B.A.R.C. pattern at a dose of 23.0 mJ/cm². Pattern collapse was not observed up to and including 27.0 mJ/cm².

Formulation and Exposure Example 9

PQMA/AdOMMA/EAdMA (55/20/25) terpolymer (0.160 g), tris(vinyloxybutyl)cyclohexane 1,2,4-tricarboxylate (0.049 g), 3-hydroxyphenyl-N,N-dimethylaminium 4-hydroxyphenylacetate (0.057 g) and bis[tris(4-vinyloxyethoxyphenyl)sulfonium]perfluorobutanedisulfonate (0.0047 g) were dissolved in a mixture of 13.63 g of propyleneglycol monomethylether, 5.84 g of propyleneglycol monomethylether acetate and 0.25 g of γ-valerolactone to form an antireflective composition (B.A.R.C. solution). The solution was filtered through a 0.2 μm micron filter.

The B.A.R.C. solution was coated on a silicon wafer, and processed as described in Formulation and Exposure Example 2. Using a scanning electron microscope (SEM), 125 nm photoresist/B.A.R.C. Lines (1:1) were obtained with clean pattern for resist and clean trench spaces with complete opening of the B.A.R.C. pattern at a dose of 23.0 mJ/cm². Pattern collapse was not observed up to and including 27.0 mJ/cm².

Formulation and Exposure Example 10

PQMA/EAdMA (60/40) copolymer (0.232 g), tris(vinyloxybutyl)cyclohexane 1,2,4-tricarboxylate (0.068 g), bis(3-hydroxyphenyl-N,N-dimethylaminium)malonate (0.0530 g) and bis[tris(4-vinyloxyethoxyphenyl)sulfonium]perfluorobutanedisulfonate (0.0068 g) were dissolved in a mixture of 13.58 g of propyleneglycol monomethylether, 5.81 g of propyleneglycol monomethylether acetate and 0.241 g of γ-valerolactone to form a photosensitive antireflective composition. The B.A.R.C. solution was filtered through a 0.2 μm micron filter.

The B.A.R.C. solution was coated on a silicon wafer, and processed as described in Formulation and Exposure Example 1. Using a scanning electron microscope (SEM), 125 nm photoresist/B.A.R.C. Lines (1:1) were obtained with clean pattern for resist and clean trench spaces with complete opening of the B.A.R.C. pattern at a dose of 20.0 mJ/cm². Pattern collapse was not observed up to and including 27 mJ/cm².

Formulation and Exposure Example 11

PQMA/EAdMA (60/40) copolymer (0.215 g), tris(vinyloxybutyl)cyclohexane 1,2,4-tricarboxylate (0.063 g), 3-hydroxyphenyl-N,N-dimethylaminium 4-hydroxyphenylacetate (0.0745 g) and bis[tris(4-vinyloxyethoxyphenyl)sulfonium]perfluorobutanedisulfonate (0.0064 g) were dissolved in mixture of 13.58 g of propyleneglycol monomethylether, 5.81 g of propyleneglycol monomethylether acetate and 0.241 g of γ-valerolactone to form a photosensitive antireflective composition. The B.A.R.C. solution was filtered through a 0.2 μm micron filter.

The B.A.R.C. solution was coated on a silicon wafer, and processed as described in Formulation and Exposure Example 1. Using a scanning electron microscope (SEM), 125 nm photoresist/B.A.R.C. Lines (1:1) were obtained with clean pattern for resist and clean trench spaces with complete opening of the B.A.R.C. pattern at a dose of 20.0 mJ/cm². Pattern collapse was not observed up to and including 27 mJ/cm².

Formulation and Exposure Example 12

PQMA/EAdMA (60/40) copolymer (0.232 g), tris(vinyloxybutyl)cyclohexane 1,2,4-tricarboxylate (0.0683 g), bis(3-hydroxyphenyl-N,N-dimethylaminium) malonate (0.0525 g) and bis[tris(4-vinyloxyethoxyphenyl)sulfonium] perfluorobutanedisulfonate (0.0068 g) were dissolved in a mixture of 13.58 g of propyleneglycol monomethylether, 5.81 g of propyleneglycol monomethylether acetate and 0.241 g of γ-valerolactone to form an antireflective composition (B.A.R.C. solution). The solution was filtered through a 0.2 μm micron filter.

The B.A.R.C. solution was coated on a silicon wafer, and processed as described in Formulation and Exposure Example 1. Using a scanning electron microscope (SEM), 125 nm photoresist/B.A.R.C. Lines (1:1) were obtained with clean pattern for resist and clean trench spaces with complete opening of the B.A.R.C. pattern at a dose of 20.0 mJ/cm². Pattern collapse was not observed up to and including 27 mJ/cm².

Formulation and Exposure Example 13

4-Hydroxystyrene/methylmethacrylate (55/45) copolymer (0.110 g), 4-yydroxystyrene/methylmethacrylate (30/70) copolymer (0.090 g), tetramethoxymethylglycoluril (0.06 g), and triethylaminium 4-hydroxybenzenesulfonate (0.05 g) were dissolved in a mixture of 9.825 g of propyleneglycol monomethyletheracetate, 4.25 g of propyleneglycol monomethylether and 0.475 g of γ-valerolactone to form a photosensitive antireflective composition. The B.A.R.C. solution was filtered through a 0.2 μm micron filter.

The B.A.R.C. solution was coated on a silicon wafer, and processed as described in Example 1. Using a scanning electron microscope (SEM), clean 80 nm photoresist. lines (1:1) were obtained on B.A.R.C. film at a dose of 25.5 mJ/cm². The B.A.R.C. film was not removed after development with the aqueous alkaline developer.

Formulation and Exposure Example 14

4-Hydroxystyrene/methylmethacrylate (55/45) copolymer (0.110 g), 4-hydroxystyrene/methylmethacrylate (30/70) copolymer (0.090 g), tetramethoxymethylglycoluril (0.06 g), and 3-hydroxyphenyl-N,N-dimethylaminium 4-hydroxybenzenesulfonate (0.05 g) were dissolved in a mixture of 9.825 g of propyleneglycol monomethyletheracetate, 4.25 g of propyleneglycol monomethylether and 0.475 g of γ-valerolactone to form a photosensitive antireflective composition. The solution was filtered through a 0.2 µm micron filter.

The B.A.R.C. solution was coated on a silicon wafer, and processed as described in Example 1. Using a scanning electron microscope (SEM), clean 80 nm photoresist Lines (1:1) were obtained on the B.A.R.C. film at a dose of 25.5 mJ/cm$^2$. The B.A.R.C. coating was not developed by the aqueous alkaline developer.

Formulation and Exposure Example 15

4-Hydroxystyrene/9-anthracenemethylmethacrylate (80/20) copolymer (0.2509 g), tris(vinyloxybutyl)cyclohexane 1,2,4-tricarboxylate (0.0634 g), triethylaminium 4-hydroxyphenylacetate (0.0304 g) and triphenylsulfonium triflouromethanesulfonate (0.0157 g) is dissolved in a mixture of 15.9233 g of propyleneglycol monomethylether, 7.3875 g of propyleneglycol monomethyletheracetate, 1.1687 g of γ-valerolactone and 0.7704 g of ethyl lactate to form a photosensitive antireflective composition. The B.A.R.C. solution is filtered through a 0.2 µm micron filter.

The B.A.R.C. solution is coated on a silicon wafer and heated on a hotplate at 180° C. for 60 seconds to give a film thickness of about 600 Å. The B.A.R.C. wafer is prewet with a solvent and coated with a commercially available 248 nm photoresist and heated on a hotplate for 95° C. for 90 seconds to give a film thickness of about 200 nm. The coated wafer is exposed using Canon FPA3000EX5 248 nm stepper for imagewise exposure through a mask. The exposed wafer is then post exposure baked for 90 seconds at 105° C. and followed with a 60 second puddle development at 23° C. using of AZ® 300 MIF Developer (2.38 wt % TMAH aqueous solution available from AZ Electronic Materials USA Corp., 70 Meister Ave., Somerville N.J.). Using a Scanning Electron Microscope (SEM), the developed photoresist and B.A.R.C. pattern can be observed.

Comparative Example 1

PQMA/EAdMA (60/40) copolymer (0.2394 g), tris(vinyloxybutyl)cyclohexane 1,2,4-tricarboxylate (0.0718 g), bis(triethylaminium)malonate (0.0438 g) and bis[tris(4-vinyloxyethoxyphenyl)sulfonium]perfluorobutanedisulfonate (0.0050 g) were dissolved in mixture of 13.57 g of propyleneglycol monomethylether, 5.81 g of propyleneglycol monomethylether acetate and 0.241 g of γ-valerolactone to form an antireflective composition (B.A.R.C. solution). The solution was filtered through a 0.2 µm micron filter. The B.A.R.C. solution was coated on a silicon wafer, and processed as described in Formulation and Exposure Example 1. Using a Scanning Electron Microscope (SEM), patterns were inspected, but 125 nm photoresist/B.A.R.C. Lines (1:1) showed scum and B.A.R.C. was not completely dissolved at dose to print (20 mJ/cm$^2$).

Comparative Example 2

PQMA/EAdMA (60/40) copolymer (0.2244 g), tris(vinyloxybutyl)cyclohexane 1,2,4-tricarboxylate (0.0673 g), (triethylaminium)phenylacetate (0.0635 g) and bis[tris(4-vinyloxyethoxyphenyl)sulfonium]perfluorobutanedisulfonate (0.0047 g) were dissolved in a mixture of 13.57 g of propyleneglycol monomethylether, 5.81 g of propyleneglycol monomethylether acetate and 0.241 g of γ-valerolactone to form an antireflective composition (B.A.R.C. solution). The solution was filtered through a 0.2 µm micron filter. The B.A.R.C. solution was coated on a silicon wafer, and processed as described in Formulation and Exposure Example 1. Using a Scanning Electron Microscope (SEM), patterns were inspected, but 125 nm photoresist/B.A.R.C. Lines (1:1) showed scum and B.A.R.C. was not completely dissolved at dose to print (20 mJ/cm$^2$).

Comparative Example 3

PQMA/EAdMA (60140) copolymer (0.2336 g), tris(vinyloxybutyl)cyclohexane 1,2,4-tricarboxylate (0.0701 g), Bis(triethylaminium)terephthalate (0.0514 g) and bis[tris(4-vinyloxyethoxyphenyl)sulfonium]perfluorobutanedisulfonate (0.0049) were dissolved in a mixture of 13.58 g of propyleneglycol monomethylether, 5.82 g of propyleneglycol monomethylether acetate and 0.241 g of γ-valerolactone to form an antireflective composition (B.A.R.C. solution). The solution was filtered through a 0.2 µm micron filter. The B.A.R.C. solution was coated on a silicon wafer, and processed as described in Formulation and Exposure Example 2. Using a Scanning Electron Microscope (SEM), patterns were inspected, but 125 nm photoresist/B.A.R.C. Lines (1:1) showed footing and B.A.R.C. was not completely dissolved at dose to print (23 mJ/cm$^2$).

Comparative Example 4

PQMA/EAdMA (60/40) copolymer (0.2331 g), tris(vinyloxybutyl)cyclohexane 1,2,4-tricarboxylate (0.0699 g), bis(triethylaminium) cyclohexane-3,4-dicarboxylate (0.0521 g) and bis[tris(4-vinyloxyethoxyphenyl)sulfonium]perfluorobutanedisulfonate (0.0049 g) were dissolved in mixture of 13.58 g of propyleneglycol monomethylether, 5.82 g of propyleneglycol monomethylether acetate and 0.241 g of γ-valerolactone to form an antireflective composition (B.A.R.C. solution). The solution was filtered through a 0.2 µm micron filter. The B.A.R.C. solution was coated on a silicon wafer, and processed as described in Formulation and Exposure Example 2. Using a Scanning Electron Microscope (SEM), patterns were inspected, but 125 nm photoresist/B.A.R.C. Lines (1:1) showed footing and B.A.R.C. was not completely dissolved at dose to print (23 mJ/cm$^2$).

Comparative Example 5

PQMA/EAdMA (60/40) copolymer (0.209 g), tris(vinyloxybutyl)cyclohexane 1,2,4-tricarboxylate (0.0558 g), bis(triethylaminium)malonate (0.0323 g) and bis(triphenylsulfonium)perfluorobutanedisulfonate (0.0023 g) were dissolved in mixture of 24.68 g of propyleneglycol monomethylether and 0.0203 g of γ-valerolactone to form an antireflective composition (B.A.R.C. solution). The solution was filtered through a 0.2 µm micron filter.

The B.A.R.C. solution was coated on a silicon wafer, and processed as described in Example 1. Using a Scanning Electron Microscope (SEM), patterns were inspected, but 125 nm photoresist/B.A.R.C. Lines (1:1) showed scum and B.A.R.C. was not completely dissolved at dose to print (20 mJ/cm$^2$).

The invention claimed is:
1. An antireflective coating composition comprising a crosslinking agent, a polymer comprising at least one chromophore group and at least one hydroxyl and/or a carboxyl group, and an additive, further where the additive has structure 1 and comprises at least one arylene-hydroxyl moiety,

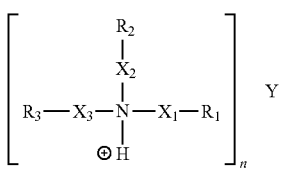
(1)

where Y is a carboxylate anion, $R_1$, $R_2$, and $R_3$ are independently selected from a group consisting of unsubstituted $C_1$-$C_8$ alkyl, substituted $C_1$-$C_8$ alkyl, aryl and arylene-hydroxyl; $X_1$, $X_2$, and $X_3$ are independently selected from a group consisting of direct valence bond and $C_1$-$C_8$ alkylene group; and, n=1, 2 or 3.

2. The composition of claim 1, where Y is structure 2,

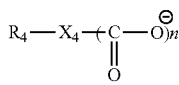
(2)

where $R_4$ is selected from a group consisting of unsubstituted $C_1$-$C_8$ alkyl, substituted $C_1$-$C_8$ alkyl, aryl, unsubstituted $C_1$-$C_8$ alkylene, substituted $C_1$-$C_8$ alkylene, arylene, arylene-hydroxyl and mixtures thereof; $X_4$ is a direct valence bond or a $C_1$-$C_8$ alkylene group; and, n=1, 2 or 3.

3. The composition of claim 2, where $R_4$ is an arylene-hydroxyl moiety.

4. The composition of claim 1, where the arylene-hydroxyl moiety is selected from a group consisting of structure 4, 5 and 6,

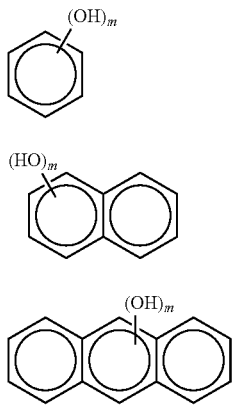

where m=1, 2 or 3.

5. The composition of claim 1, where Y comprises an arylene-hydroxyl moiety.

6. The composition of claim 1, where Y comprises an arylene-hydroxyl moiety selected from a group consisting of structures 2, 3; and, 4

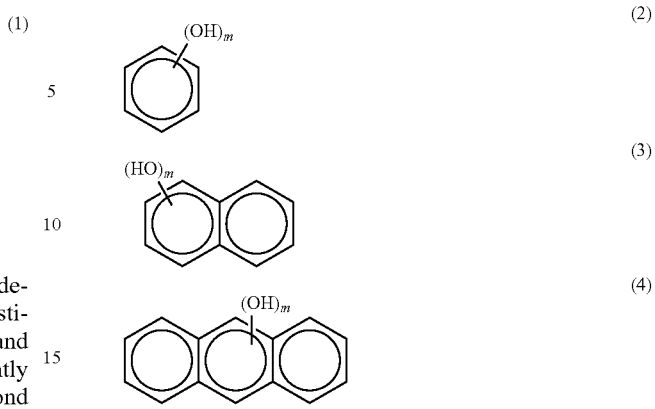

where m=1, 2 or 3.

7. The composition of claim 1, where at least one of $R_1$, $R_2$, and $R_3$ is an arylene-hydroxyl moiety.

8. The composition of claim 1, where the additive is of structure 12,

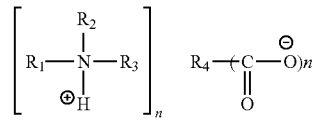
(12)

where $R_1$, $R_2$, and $R_3$ are independently selected from a group consisting of $C_1$-$C_8$ alkyl, aryl and arylene-hydroxyl; $R_4$ is selected from a group consisting of $C_1$-$C_8$ alkyl, aryl, $C_1$-$C_8$ alkylene, arylene, arylene-hydroxyl and mixtures thereof; and, n=1, 2 or 3, further where at least one of $R_1$, $R_2$, $R_3$, and $R_4$ is an arylene-hydroxy group.

9. The composition of claim 8, where $R_4$ comprises an arylene-hydroxy group.

10. The composition according to claim 1, wherein the chromophore group is selected from a group consisting of a substituted phenyl group, unsubstituted phenyl group, substituted anthracyl group, unsubstituted anthracyl group, substituted phenanthryl group, unsubstituted phenanthryl group, substituted naphthyl group, unsubstituted naphthyl group, substituted heterocyclic aromatic rings containing heteroatoms selected from oxygen, nitrogen and sulfur, and unsubstituted heterocyclic aromatic rings containing heteroatoms selected from oxygen, nitrogen and sulfur, and a mixture thereof.

11. The composition according to claim 1, wherein the hydroxyl and/or a carboxyl group is derived from a monomer selected from a group consisting of acrylic acid, methacrylic acid, vinyl alcohol, hydroxystyrenes, vinyl monomers containing 1,1,1,3,3,3-hexafluoro-2-propanol, and mixtures of these monomers.

12. The composition according to claim 1, wherein the chromophore group and the hydroxyl and/or a carboxyl group are present in one monomeric unit.

13. The composition according to claim 1, wherein the chromophore group and the hydroxyl and/or a carboxyl group are present in differing monomeric units.

14. The composition according to claim 1, where Y is structure 2,

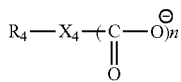

(2)

where $R_4$ is selected from a group consisting of $C_1$-$C_8$ alkyl, aryl, $C_1$-$C_8$ alkylene, arylene, arylene-hydroxyl and mixtures thereof; $X_4$ is a direct valence bond or a $C_1$-$C_8$ alkylene group; n=1, 2 or 3; and further where the crosslinking agent is represented by the structure below;

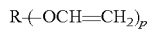

wherein, R is selected from a group consisting of a ($C_1$-$C_{30}$) linear alkyl, ($C_1$-$C_{30}$) branched alkyl, ($C_1$-$C_{30}$) of cyclic alkyl, substituted ($C_6$-$C_{40}$) aryl, unsubstituted ($C_6$-$C_{40}$) aryl, substituted ($C_7$-$C_{40}$) alicyclic hydrocarbon and unsubstituted ($C_7$-$C_{40}$) alicyclic hydrocarbon; and p≥2.

15. The composition according to claim 14, where $R_4$ comprises an arylene-hydroxyl moiety.

16. A process for forming a positive image comprising:
a) forming a coating of the bottom photoimageable antireflective coating composition of claim 1 on a substrate;
b) baking the antireflective coating,
c) providing a coating of a top photoresist layer over the bottom coating;
d) imagewise exposing the photoresist and bottom coating layers to actinic radiation;
e) post-exposure baking the photoresist and bottom coating layers on the substrate; and,
f) developing the photoresist and bottom coating layers with an aqueous alkaline solution, thereby forming a pattern in the photoresist and the antireflective coating film.

17. The process according to claim 16, wherein the antireflective coating becomes insoluble in organic solvents and aqueous alkaline solution after the baking step prior to coating the photoresist layer and becomes soluble in aqueous alkaline solution after exposure to actinic radiation prior to developing the photoresist and bottom antireflective coating layer.

18. A process for forming a positive image comprising:
a) forming a coating of the antireflective coating composition of claim 1 on a substrate;
b) baking the antireflective coating,
c) providing a coating of a top photoresist layer over the bottom coating;
d) imagewise exposing the photoresist to actinic radiation;
e) post-exposure baking the photoresist and bottom coating layers on the substrate; and,
f) developing the photoresist with an aqueous alkaline solution, thereby forming a photoresist pattern on the antireflective coating.

* * * * *